(12) United States Patent
Iwata et al.

(10) Patent No.: US 7,859,881 B2
(45) Date of Patent: Dec. 28, 2010

(54) MAGNETIC MEMORY DEVICE AND WRITE/READ METHOD OF THE SAME

(75) Inventors: Yoshihisa Iwata, Yokohama (JP); Katsuyuki Fujita, Yokohama (JP); Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 503 days.

(21) Appl. No.: 11/672,261

(22) Filed: Feb. 7, 2007

(65) Prior Publication Data

US 2008/0080234 A1   Apr. 3, 2008

(30) Foreign Application Priority Data

Oct. 3, 2006   (JP) ............................. 2006-272039

(51) Int. Cl.
*G11C 19/00*   (2006.01)
(52) U.S. Cl. .................... 365/81; 365/130; 365/158; 365/173; 365/225.5; 365/243.5; 977/933
(58) Field of Classification Search .................. 365/66, 365/80–85, 100, 148, 158, 171, 173, 225.5, 365/243.5; 257/421, E21.665; 438/3; 977/934, 977/935
See application file for complete search history.

(56) References Cited

U.S. PATENT DOCUMENTS

| | | | |
|---|---|---|---|
| 3,369,225 A * | 2/1968 | Fuller ............................ | 365/87 |
| 6,834,005 B1 | 12/2004 | Parkin | |
| 2002/0186514 A1 * | 12/2002 | Childress et al. ......... | 360/324.2 |
| 2004/0251232 A1 | 12/2004 | Chen et al. | |
| 2004/0252538 A1 * | 12/2004 | Parkin .......................... | 365/80 |
| 2004/0252539 A1 * | 12/2004 | Parkin .......................... | 365/80 |
| 2004/1025253 | 12/2004 | Parkin | |
| 2005/0078509 A1 * | 4/2005 | Parkin ........................ | 365/158 |
| 2005/0078511 A1 | 4/2005 | Parkin | |
| 2005/0094427 A1 * | 5/2005 | Parkin .......................... | 365/80 |
| 2005/0226043 A1 * | 10/2005 | Parkin et al. ................ | 365/173 |
| 2006/0120132 A1 * | 6/2006 | Parkin .......................... | 365/80 |

OTHER PUBLICATIONS

D.H. Smith, "A Magnetic Shift Register Employing Controlled Domain Wall Motion", IEEE Transactions on Magnetics, vol. MAG-1, No. 4, Dec. 1965, pp. 281-284.
J.S. Sallo, et al., "An "Orthocore" Magnetic Shift Register", IEEE Transactions on Magnetics, vol. MAG-2, No. 3, Sep. 1966, pp. 197-201.
A. Yamaguchi, et al., "Real-Space Observation of Current-Driven Domain Wall Motion in Submicron Magnetic Wires", Physical Review Letters, vol. 92, No. 7, 077205-1, Feb. 20, 2004, 4 pages.
Nikkei Electronics, No. 14, Mar. 2005, one page.

* cited by examiner

*Primary Examiner*—Richard Elms
*Assistant Examiner*—Harry W Byrne
(74) *Attorney, Agent, or Firm*—Oblon, Spivak, McClelland, Maier & Neustadt, L.L.P.

(57) ABSTRACT

A magnetic memory device includes a first magnetic line which has a plurality of cells made of magnetic domains partitioned by domain walls, and in which information is recorded in each cell, a first write element formed at one end portion of the first magnetic line, and a first read element formed at the other end portion of the first magnetic line.

20 Claims, 27 Drawing Sheets

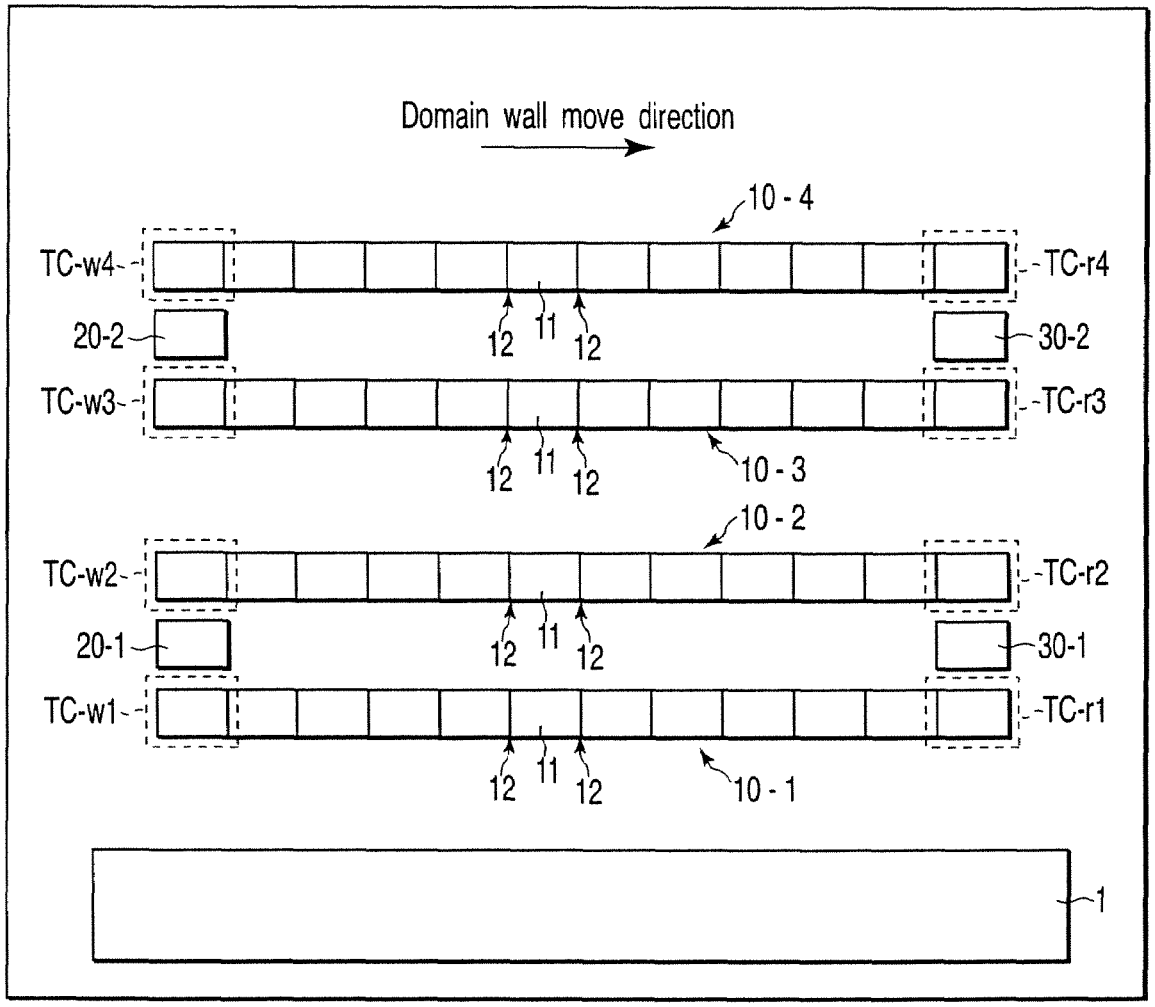
F I G. 9

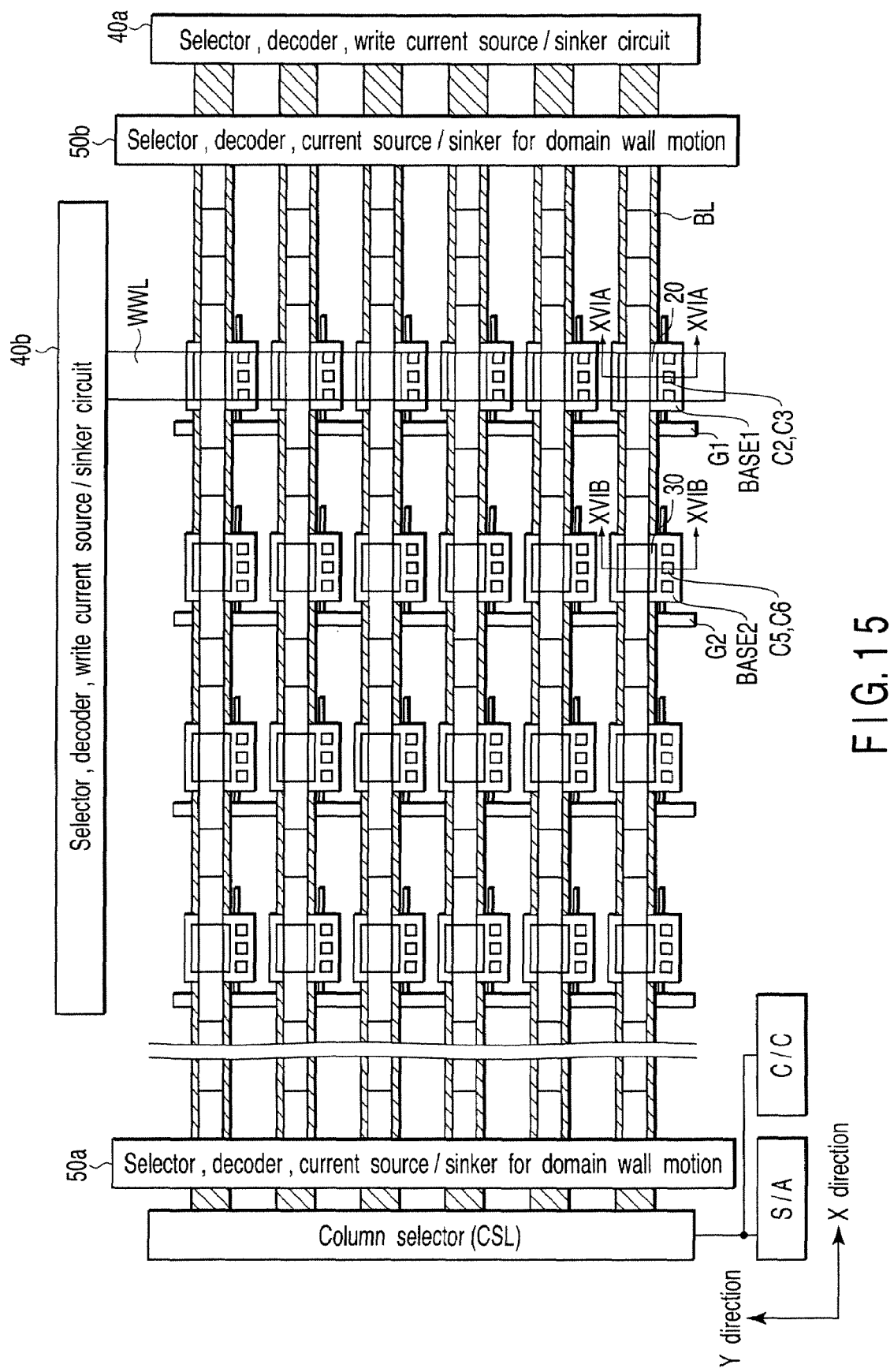
F I G. 15

MAGNETIC MEMORY DEVICE AND WRITE/READ METHOD OF THE SAME

CROSS-REFERENCE TO RELATED APPLICATIONS

This application is based upon and claims the benefit of priority from prior Japanese Patent Application No. 2006-272039, filed Oct. 3, 2006, the entire contents of which are incorporated herein by reference.

BACKGROUND OF THE INVENTION

1. Field of the Invention

The present invention relates to a magnetic memory device having a magnetic line in which information is recorded in each magnetic domain partitioned by domain walls, and a write/read method of the same.

2. Description of the Related Art

Recently, current-driven domain wall motion is reportedly observed in a thin magnetic line having a submicron width (e.g., non-patent reference 1), and magnetic shift registers capable of domain wall motion by using this effect are proposed (e.g., patent references 1 and 2, and non-patent reference 2). Each of these proposals implements a magnetic memory device having a structure similar to that of a magnetic tape by moving domain walls by an electric current with use of a magnetic line divided into a plurality of magnetic domains. The capacity of such a magnetic memory is now demanded to be increased by, e.g., raising the density of cells in a magnetic shift register.

[Patent reference 1] U.S. Pat. No. 6,834,005
[Patent reference 2] U.S.P. Publication No. 2004/0252538
[Non-patent reference 1] A. Yamaguchi et al., Phys Rev. Lett 92, 077205 (2004)
[Non-patent reference 2] Nikkei Electronics, No. 14, March 2005, pp. 26-27

BRIEF SUMMARY OF THE INVENTION

A magnetic memory device according to the first aspect of the present invention comprises a first magnetic line which has a plurality of cells made of magnetic domains partitioned by domain walls, and in which information is recorded in each cell, a first write element formed at one end portion of the first magnetic line, and a first read element formed at the other end portion of the first magnetic line.

A magnetic memory device write method according to the second aspect of the present invention is a write method of a magnetic memory device including a first magnetic line which has a plurality of cells made of magnetic domains partitioned by domain walls, and in which information is recorded in each cell, a first write element formed at one end portion of the first magnetic line, and a first read element formed at the other end portion of the first magnetic line, comprising checking whether a target cell as an object of write exists at one end portion of the first magnetic line, writing information in the target cell by using the first write element, if a result of the check indicates that the target cell exists at one end portion of the first magnetic line, reading out information from a first cell at the other end portion of the first magnetic line by using the first read element, and storing the information of the first cell, if the result of the check indicates that the target cell does not exist at one end portion of the first magnetic line, moving the domain walls by one cell by supplying an electric current to the first magnetic line, and writing the information of the first cell into a second cell at one end portion of the first magnetic line by using the first write element, and checking whether the second cell is the target cell.

A magnetic memory device read method according to the third aspect of the present invention is a read method of a magnetic memory device including a first magnetic line which has a plurality of cells made of magnetic domains partitioned by domain walls, and in which information is recorded in each cell, a first write element formed at one end portion of the first magnetic line, and a first read element formed at the other end portion of the first magnetic line, comprising checking whether a target cell as an object of read exists at the other end portion of the first magnetic line, reading out information from the target cell by using the first read element, if a result of the check indicates that the target cell exists at the other end portion of the first magnetic line, reading out information from a first cell at the other end portion of the first magnetic line by using the read element, and storing the information of the first cell, if the result of the check indicates that the target cell does not exist at the other end portion of the first magnetic line, moving the domain walls by one cell by supplying an electric current to the first magnetic line, and writing the information of the first cell into a second cell at one end portion of the magnetic line by using the write element, and checking whether a target cell as an object of read exists at the other end portion of the first magnetic line, after moving the domain walls by one cell by supplying an electric current to the first magnetic line.

BRIEF DESCRIPTION OF THE SEVERAL VIEWS OF THE DRAWING

FIG. 9 is a schematic view showing another magnetic memory device according to the second embodiment of the present invention;

FIG. 15 is a schematic view showing the layout of the magnetic memory device according to the fifth embodiment of the present invention;

DETAILED DESCRIPTION OF THE INVENTION

Figure 1:
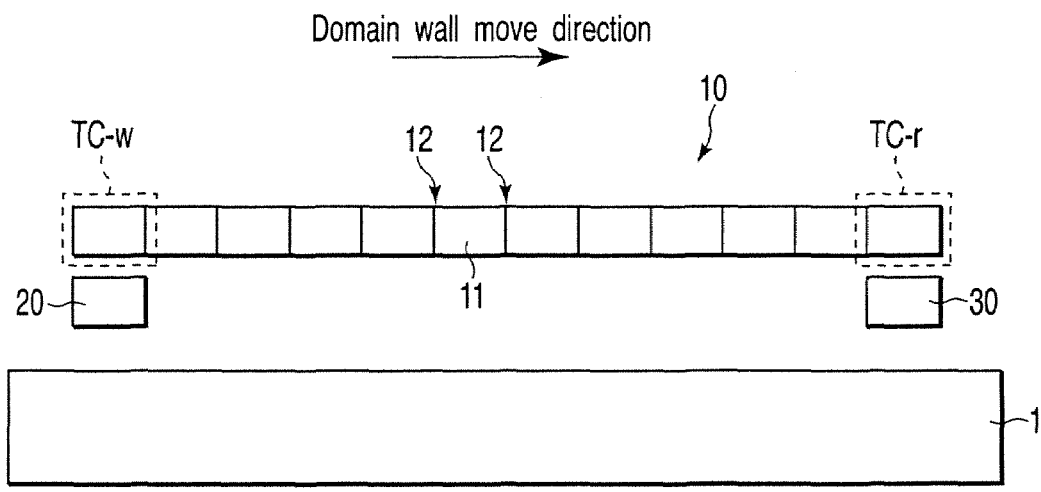
FIG. 1 is a schematic view showing a magnetic memory device according to the first embodiment of the present invention.

Embodiments of the present invention will be explained below with reference to the accompanying drawing. In the following explanation, the same reference numerals denote the same parts throughout the drawing.

[1] First Embodiment

[1-1] Structure of Magnetic Memory Device

Figure 2A:
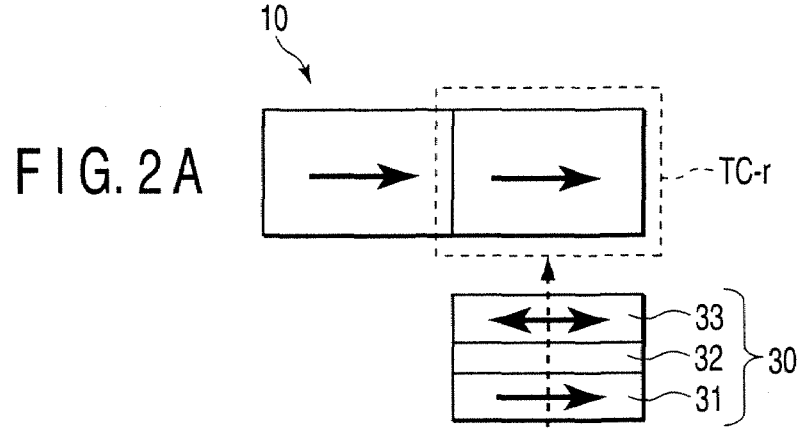
FIGS. 2A and 2B are schematic views of read elements according to the first embodiment of the present invention.
Figure 2B:
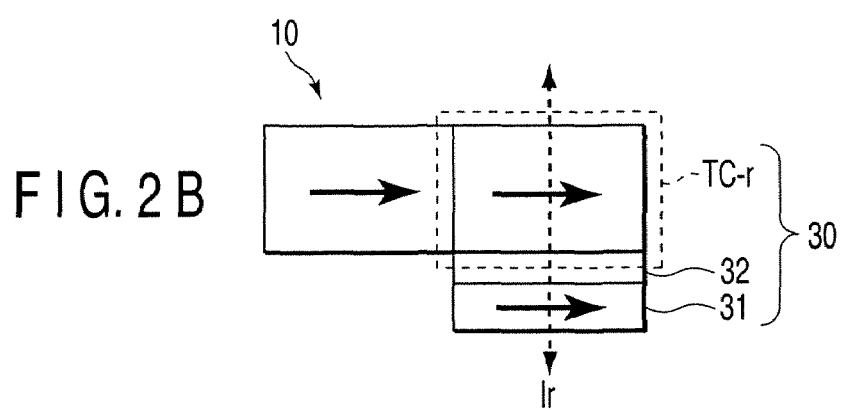

FIG. 1 is a schematic view of a magnetic memory device according to the first embodiment of the present invention. FIGS. 2A and 2B are schematic views of read elements according to the first embodiment of the present invention. The magnetic memory device according to the first embodiment will be explained below.

As shown in FIG. 1, a magnetic line 10 which functions as a storage element is placed above a semiconductor substrate 1 on which an integrated circuit (not shown) is mounted. The magnetic line 10 has, e.g., a linear shape and is made of a ferromagnetic material. The magnetic moments of the magnetic line 10 do not point in a predetermined direction as a whole, and a plurality of regions called magnetic domains 11 exist. The magnetic moments point in a predetermined direction in the region of each magnetic domain 11. A domain wall 12 exists in the boundary between the magnetic domains 11 having different magnetic moments (the domain wall 12 has a certain finite width although it is simply represented by a line in FIG. 1). Accordingly, by making the direction of the magnetic moment in the magnetic domain 11 correspond to data "1" or "0" and regarding each of the magnetic domains 11 partitioned by the domain walls 12 as a memory cell in the magnetic line 10, information "1" or "0" can be recorded in each cell made of the magnetic domain 11. Note that although no domain wall forms if adjacent cells have identical data and the directions of the magnetic moments are completely the same, it is assumed that a domain wall exists for the sake of descriptive convenience. Note also that since data is divided into two values, i.e., "1" and "0", the magnetic moments of even identical data may not be completely the same in some cases. In this case, a domain wall may exist between magnetic domains having identical data.

At one end portion of the magnetic line 10, a write element 20 is placed on the side of the semiconductor substrate 1. The write element 20 is separated from the magnetic line 10 and made of, e.g., a metal line. In a write operation, a write current Iw is supplied to the metal line, and a magnetic field generated by the write current Iw is applied to a target cell (a cell at an address to be written) TC-w positioned at one end portion of the magnetic line 10. Since this determines the magnetization direction in the target cell TC-w, data is written in it.

At the other end portion of the magnetic line 10, a read element 30 is placed on the side of the semiconductor substrate 1. As shown in FIGS. 2A and 2B, the read element 30 is made of an MTJ (Magnetic Tunnel Junction) element using the TMR (Tunneling Magneto Resistive) effect. This magnetoresistive effect element changes its resistance value in accordance with the magnetization direction in a magnetic domain.

In the example shown in FIG. 2A, the read element 30 has a fixed layer 31 in which the magnetization direction is fixed, a recording layer 33 capable of reversing the magnetization direction, and a nonmagnetic layer 32 formed between the fixed layer 31 and recording layer 33. The recording layer 33 opposes a target cell (a cell storing information to be read out) TC-r positioned at the other end portion of the magnetic line 10. A stray magnetic field from the target cell TC-r or a magnetic coupling with the target cell TC-r transfers the magnetization direction in the target cell TC-r to the recording layer 33, and data in the target cell TC-r is read out by supplying a read current Ir to the read element 30. Note that the recording layer 33 of the read element 30 can be either spatially separated from or in contact with the target cell TC-r.

In the example shown in FIG. 2B, the read element 30 has a fixed layer 31 in which the magnetization direction is fixed, a target cell TC-r positioned at the other end portion of the magnetic line 10, and a nonmagnetic layer 32 formed between the fixed layer 31 and target cell TC-r. The nonmagnetic layer 32 is in contact with the target cell TC-r. Data in the target cell TC-r is read out by supplying the read current Ir to the read element 30.

A current source (not shown) for moving the domain walls 12 of the magnetic line 10 is formed at an end portion of the magnetic line 10. An electric current Is supplied from this current source moves the target cell TC-w to a position immediately above the write element 20, and moves the target cell TC-r to a position immediately above the read element 30. In this case, the domain walls 12 of the magnetic line 10 move from one end portion of the magnetic line 10 at which the write element 20 exists to the other end portion of the magnetic line 10 at which the read element 30 exists. In other words, the write element 20 is placed at the start position in the move direction of the domain walls 12, and the read element 30 is placed at the end position in the move direction of the domain walls 12. Note that the move direction of the domain walls 12 is opposite to the flow direction of the electric current Is.

[1-2] Write/Read Operation (Write Sequence)

Figure 3:
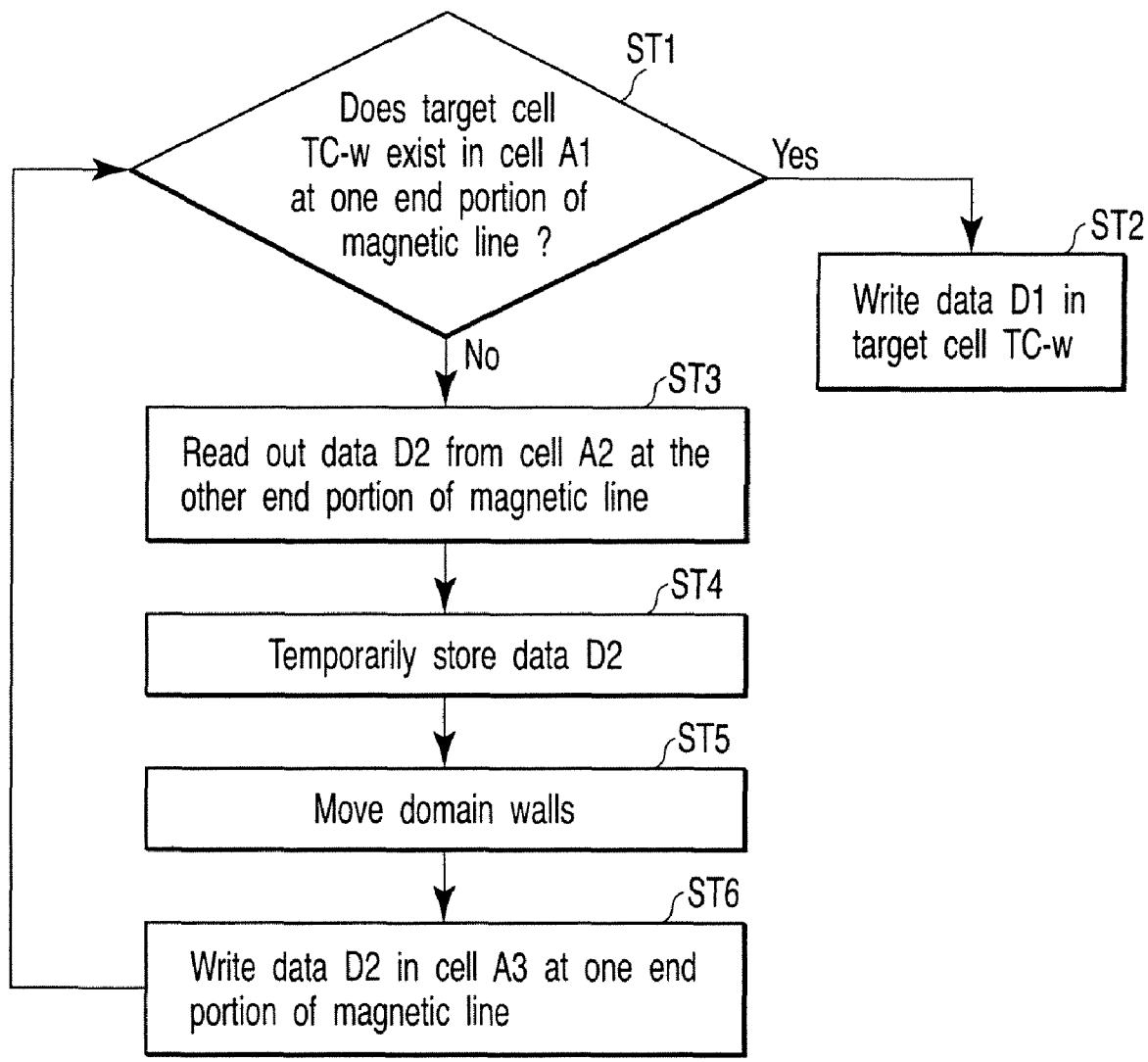
FIG. 3 is a sequence diagram of the write operation of the magnetic memory device according to the first embodiment of the present invention.

FIG. 3 is a sequence diagram of the write operation of the magnetic memory device according to the first embodiment of the present invention. FIGS. 4A to 4D are views for explaining the write operation of the magnetic memory device according to the first embodiment of the present invention. The write operation of the magnetic memory device according to the first embodiment will be explained below.

Figure 4A:
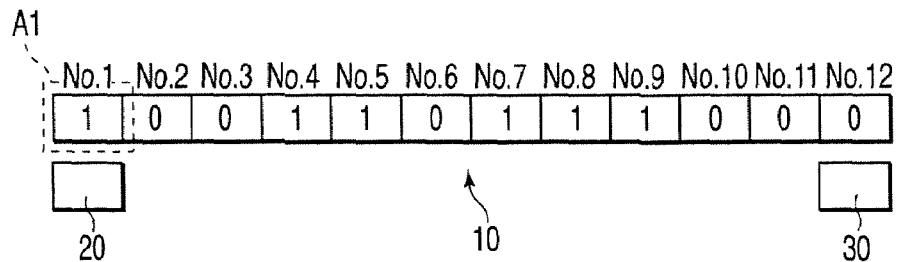
FIGS. 4A to 4D are views for explaining the write operation of the magnetic memory device according to the first embodiment of the present invention.

First, as shown in FIG. 4A, whether the target cell TC-w as an object of write exists in a cell A1 at one end portion (the end portion where the write element 20 exists) of the magnetic line 10 is checked (ST1 in FIG. 3). This check compares the address of the cell A1 with that of the target cell TC-w.

Figure 4B:
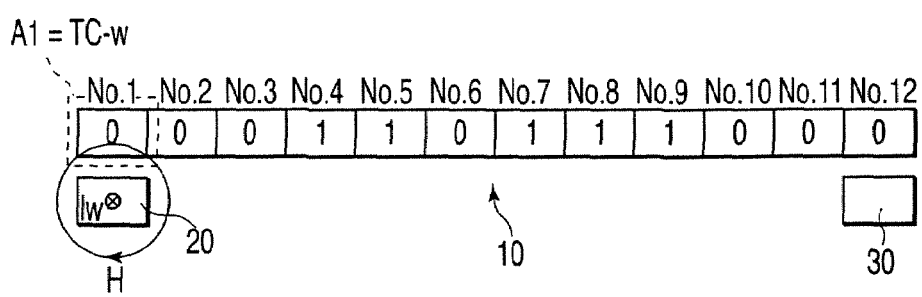

If the cell A1 is the target cell TC-w as shown in FIG. 4B, the write current Iw is supplied to the write element 20, and a magnetic field H generated in the write current Iw is applied to the target cell TC-w, thereby writing data D1 (e.g., data "0") in the target cell TC-w (ST2 in FIG. 3).

Figure 4C:
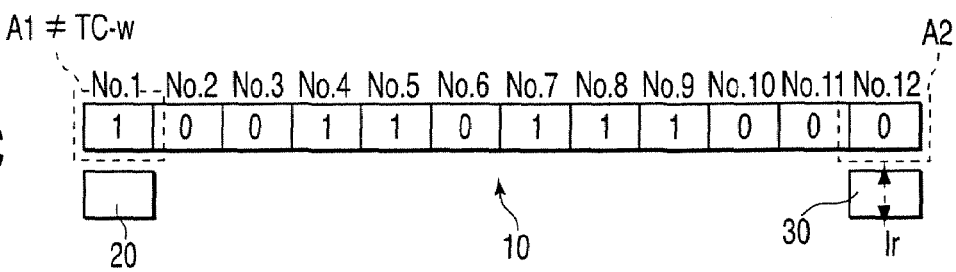

On the other hand, if the cell A1 is not the target cell TC-w as shown in FIG. 4C, the read current Ir is supplied to the read element 30 to read out data D2 (e.g., data "0") from a cell A2 at the other end portion (the end portion where the read element 30 exists) of the magnetic line 10 (ST3 in FIG. 3). The data D2 of the cell A2 is temporarily stored in, e.g., a register (ST4 in FIG. 3).

Figure 4D:
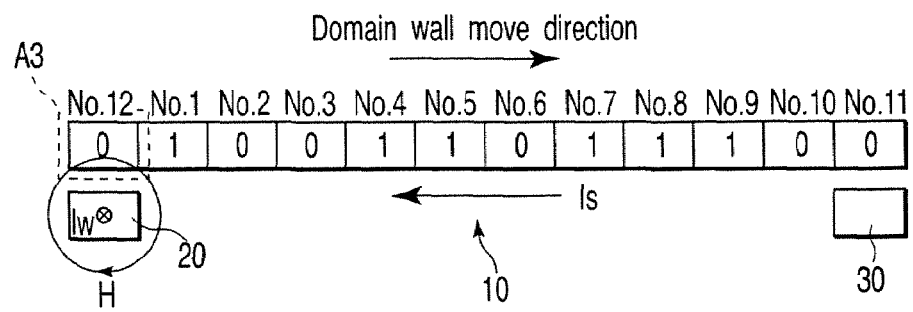

Then, as shown in FIG. 4D, the electric current Is is supplied to the magnetic line 10 to move the domain walls by, e.g., one cell (ST5 in FIG. 3). After that, the write current Iw is supplied to the write element 20, and a magnetic field H generated in the write current Iw is applied to a cell A3 at one end portion of the magnetic line 10, thereby writing the data D2 (e.g., data "0") of the cell A2 into the cell A3 (ST6 in FIG. 3).

Subsequently, whether the cell A3 at one end portion of the magnetic line 10 is the target cell TC-w as an object of write is checked again (ST1 in FIG. 3), and steps ST2 to ST6 in FIG. 3 are performed in accordance with the check result.

(Read Sequence)

Figure 5:
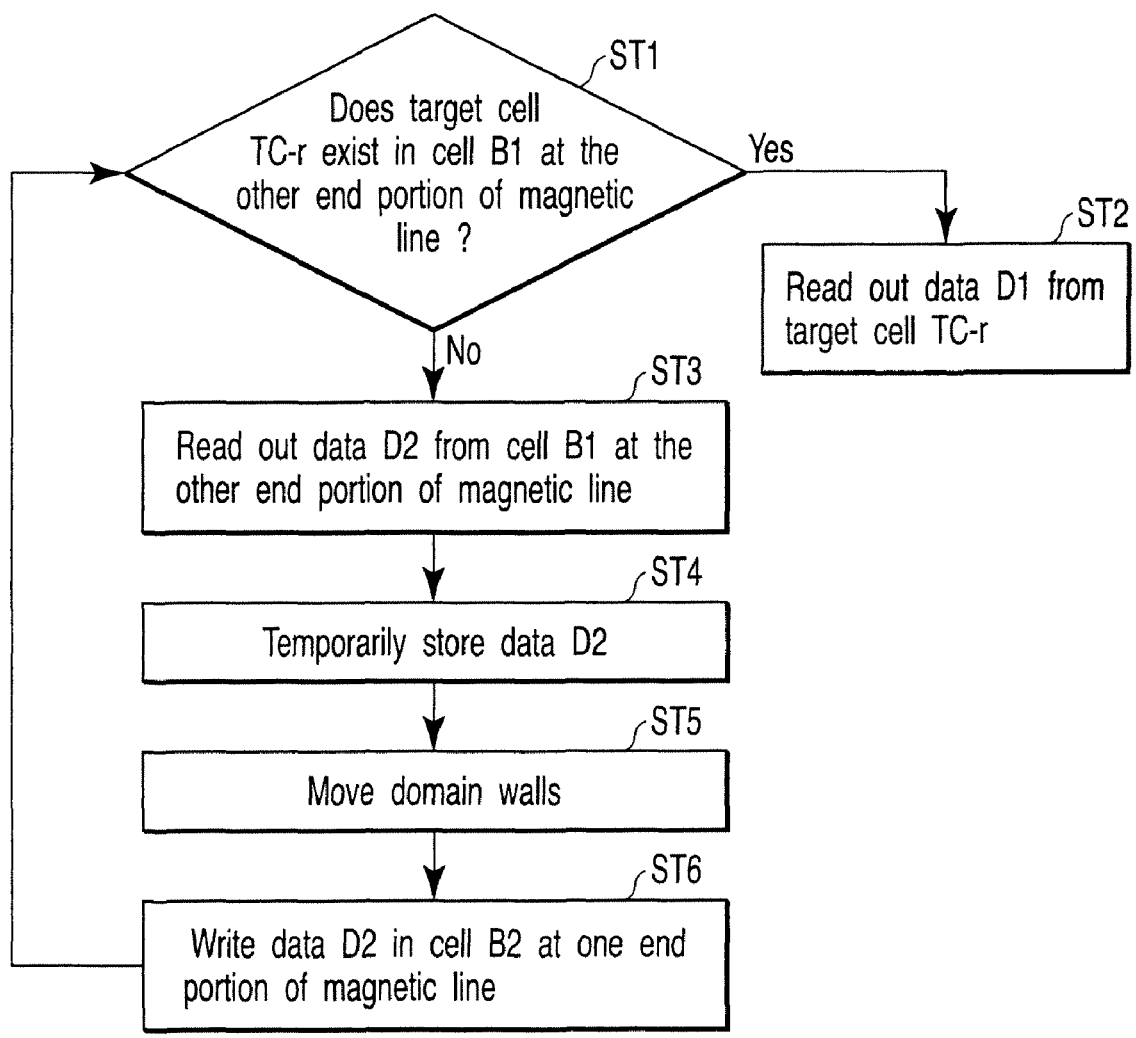
FIG. 5 is a sequence diagram of the read operation of the magnetic memory device according to the first embodiment of the present invention.

FIG. 5 is a sequence diagram of the read operation of the magnetic memory device according to the first embodiment of the present invention. FIGS. 6A to 6D are views for explaining the read operation of the magnetic memory device according to the first embodiment of the present invention.

The read operation of the magnetic memory device according to the first embodiment will be explained below.

Figure 6A:
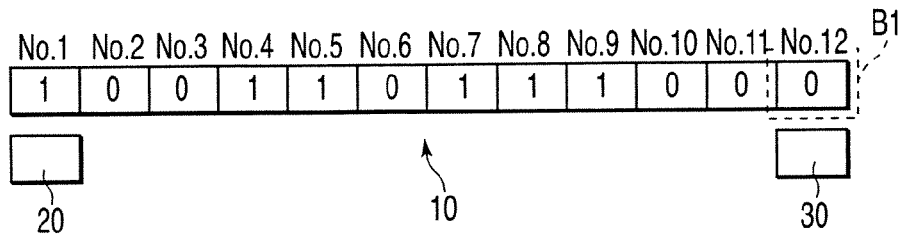
FIGS. 6A to 6D are views for explaining the read operation of the magnetic memory device according to the first embodiment of the present invention.

First, as shown in FIG. 6A, whether the target cell TC-r as an object of read exists in a cell B1 at the other end portion (the end portion where the read element 30 exists) of the magnetic line 10 is checked (ST1 in FIG. 5). This check compares the address of the cell B1 with that of the target cell TC-r.

Figure 6B:
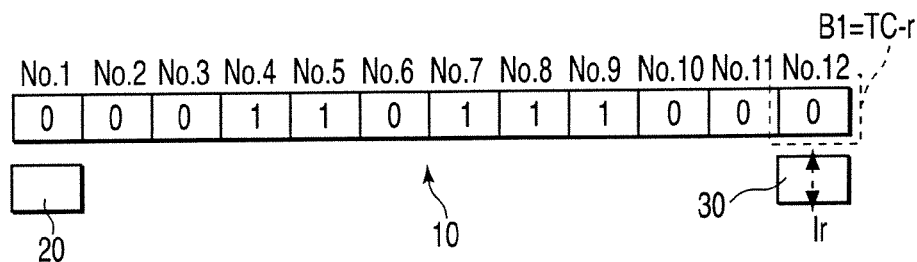

If the cell B1 is the target cell TC-r as shown in FIG. 6B, the read current Ir is supplied to the read element 30 to read out data D1 (e.g., data "0") from the target cell TC-r (ST2 in FIG. 5).

Figure 6C:
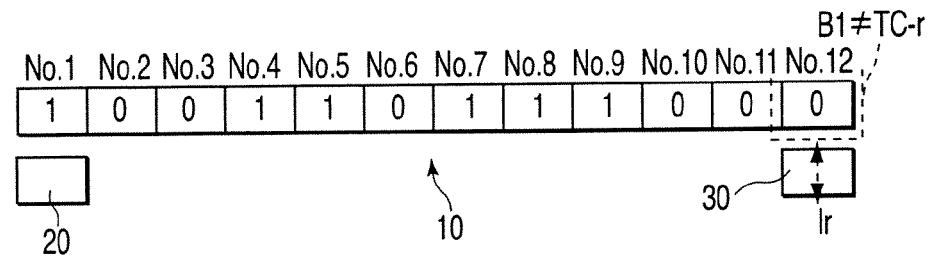

On the other hand, if the cell B1 is not the target cell TC-r as shown in FIG. 6C, the read current Ir is supplied to the read element 30 to read out data D2 (e.g., data "0") from the cell B1 (ST3 in FIG. 5). The data D2 of the cell B1 is temporarily stored in, e.g., a register (ST4 in FIG. 5).

Figure 6D:
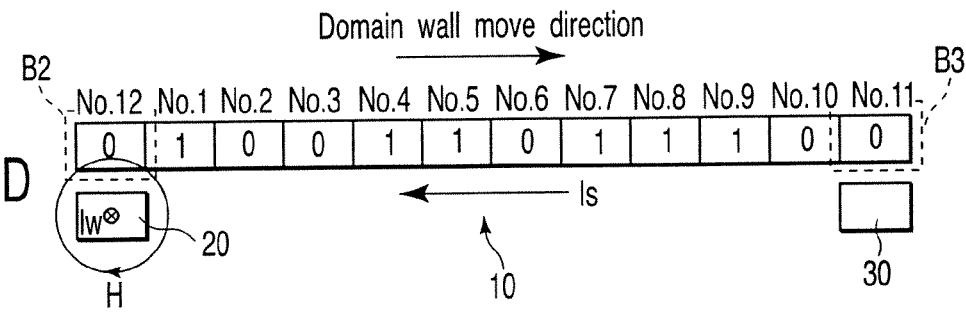

Then, as shown in FIG. 6D, the electric current Is is supplied to the magnetic line 10 to move the domain walls by, e.g., one cell (ST5 in FIG. 5). After that, the write current Iw is supplied to the write element 20, and a magnetic field H generated in the write current Iw is applied to a cell B2 at one end portion (the end portion where the write element 20 exists) of the magnetic line 10, thereby writing the data D2 (e.g., data "0") of the cell B1 into the cell B2 (ST6 in FIG. 6).

Subsequently, whether a cell B3 at one end portion of the magnetic line 10 after the domain wall motion is the target cell TC-r as an object of read is checked again (ST1 in FIG. 5), and steps ST2 to ST6 in FIG. 5 are performed in accordance with the check result.

In the write/read sequence as described above, information discharged from the magnetic line 10 by the domain wall shift is read out and written in the magnetic domain 11 at the start position of the domain wall motion. This logically forms a looped shift register. This structure allows all the magnetic domains 11 in the magnetic shift register (magnetic line 10) to be used as memory cells.

(Address Detection)

Address detection for identifying a memory cell in the magnetic line 10 can use various methods.

The number of magnetic domains (memory cells) of the magnetic line 10 can be determined by a shape, e.g., a constricted shape, or by the size or pulse width of a current pulse for domain wall movement. Therefore, when data are moved to a certain initial position whenever a read or write operation is completed, the next read or write can start from an address "0" for identifying a memory cell in the magnetic line 10. That is, assuming that the magnetic line 10 has n magnetic domains (memory cells) and the read or write address is j (0<j<n−1), the domain walls are moved by (n−j) after read or write is completed. If j=0, however, the efficiency increases with the domain walls being kept unmoved. When the read or write address is j, address detection moves the domain walls j times. Therefore, a counter is prepared, and determination is done by the count.

It is also possible to move the domain walls not whenever read or write is performed but only when the power supply is shut down. In this case, the operation is performed by sensing using a power off sensing circuit or by sensing using a potential drop. If a memory system can issue a shutdown command, the storage device operates by receiving this command signal. While an electric current is supplied, a register for storing an address presently positioned in the read or write element is prepared, and the address is stored in the register. The addresses of the target cell and register are compared, and the domain walls are moved by the difference.

In addition, no initialization is necessary if the register is nonvolatile.

Note that a method as shown in FIGS. 23 to 26 (to be described later) can also be used as the method of address detection.

[1-3] Principle of Domain Wall Movement

FIGS. 7A to 7H are schematic views for explaining the principle of domain wall movement according to the first embodiment of the present invention.

Figure 7A:
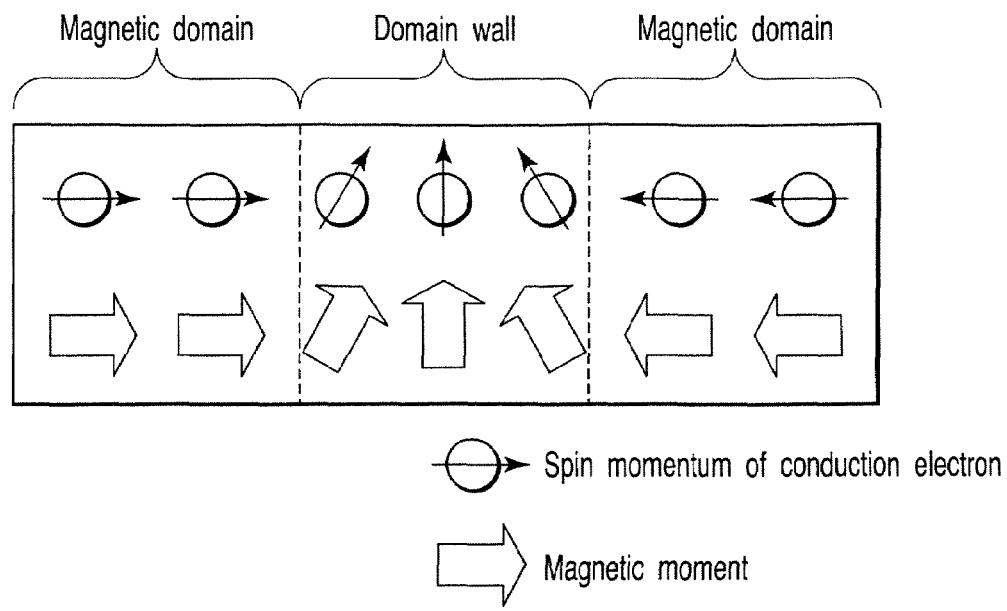
FIGS. 7A to 7H are schematic views for explaining the principle of domain wall movement according to the first embodiment of the present invention.

FIG. 7A shows a state before domain wall movement. The premises are as follows. The spin of a conduction electron in a ferromagnetic material is parallel or antiparallel to the magnetic moment (magnetization) in the ferromagnetic material (because the electron energy is low in these cases). The magnetic moment (magnetization) in the ferromagnetic material derives from the summation of the outermost shell electron spins of an atom forming the ferromagnetic material (this applies to the iron family (Fe, Co, and Ni)). Although conduction electrons are also the outermost shell electrons, it is regarded as different from an electron which causes the magnetic moment (magnetization) for a brief explanation. The principle of domain wall movement will be briefly explained below.

Figure 7B:
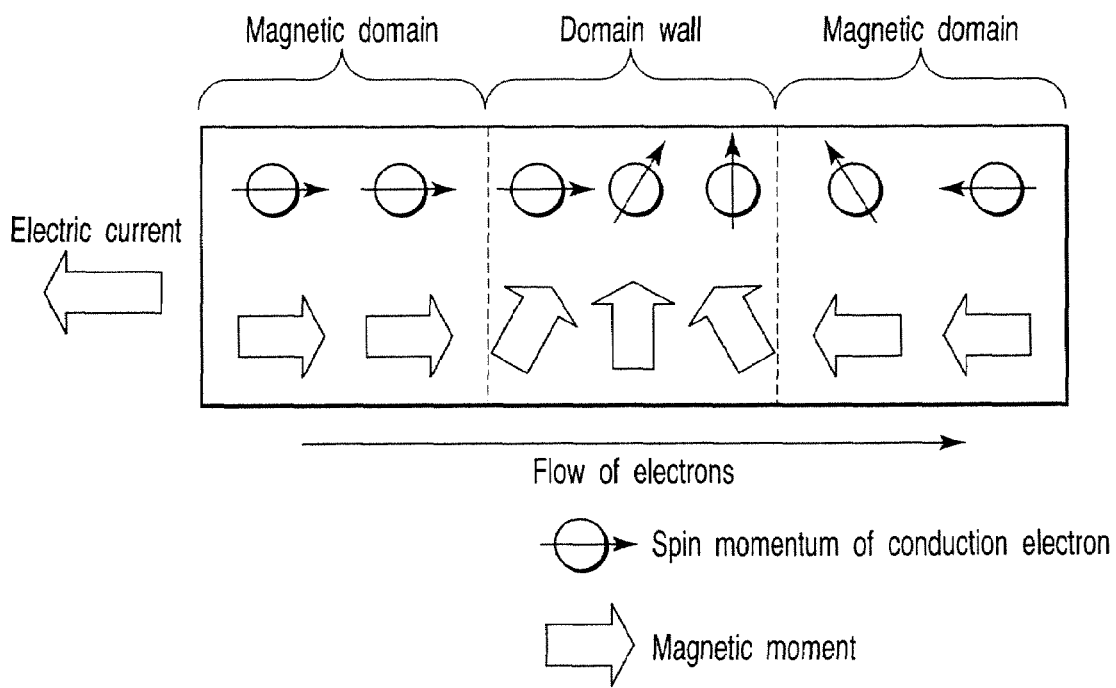
Figure 7C:
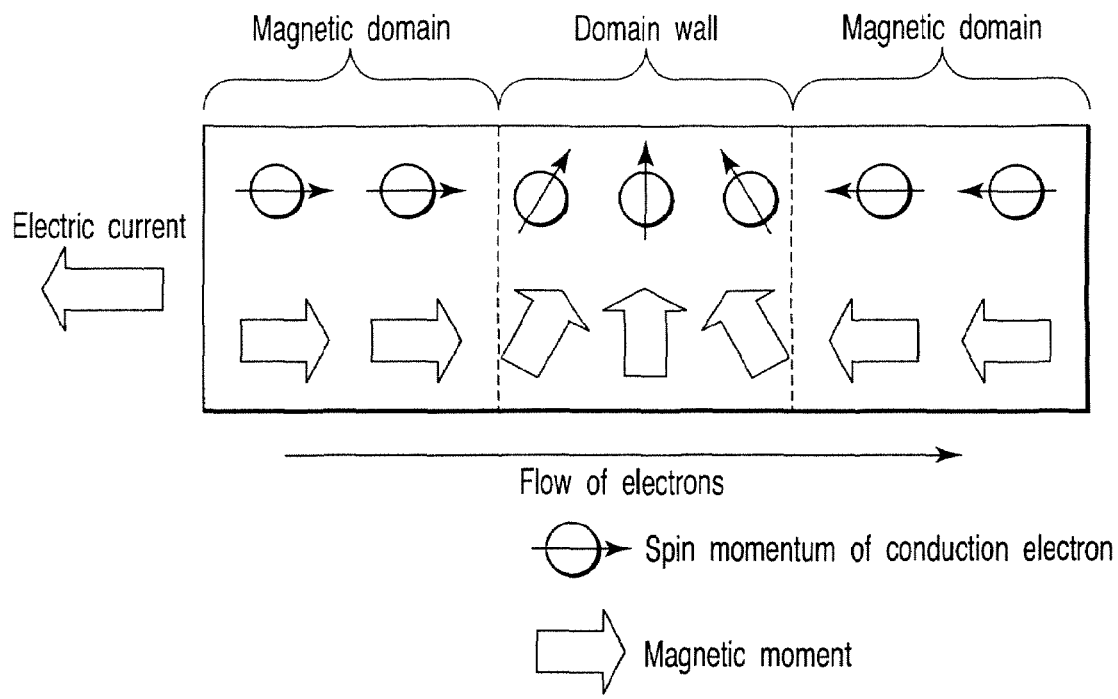
Figure 7D:
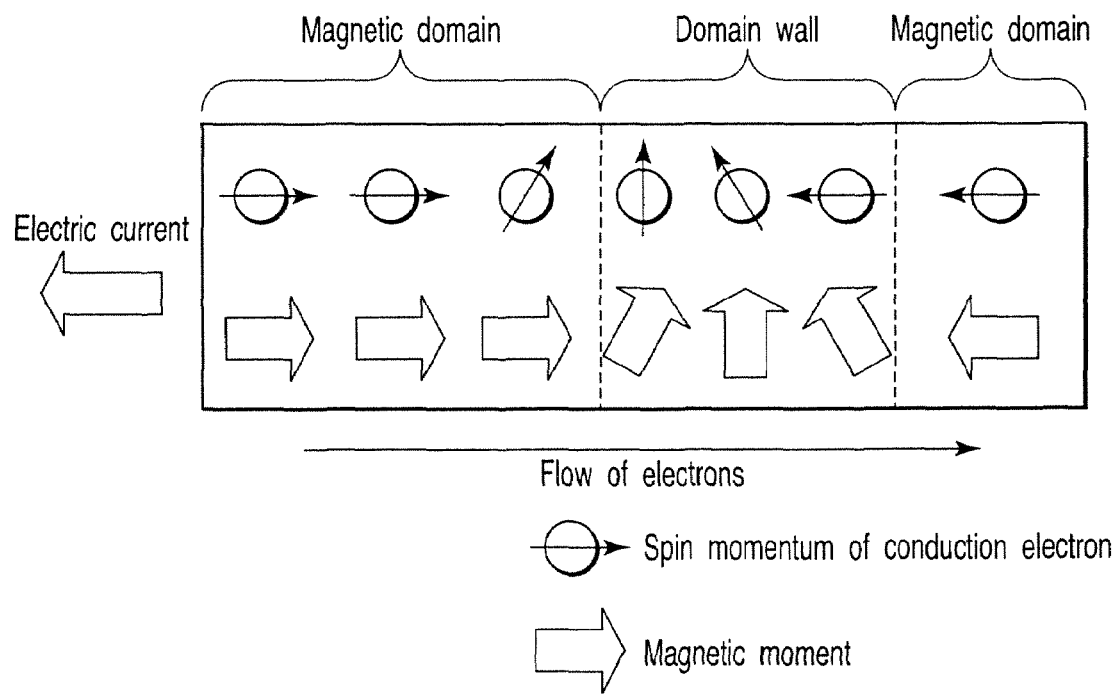
Figure 7E:
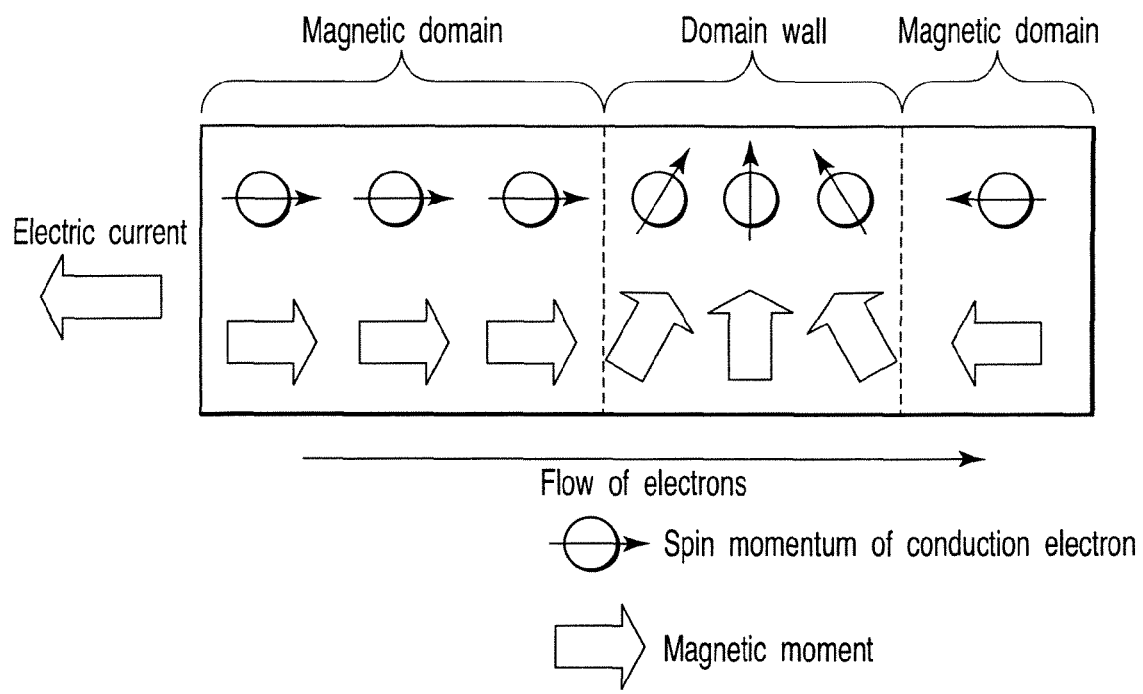
Figure 7F:
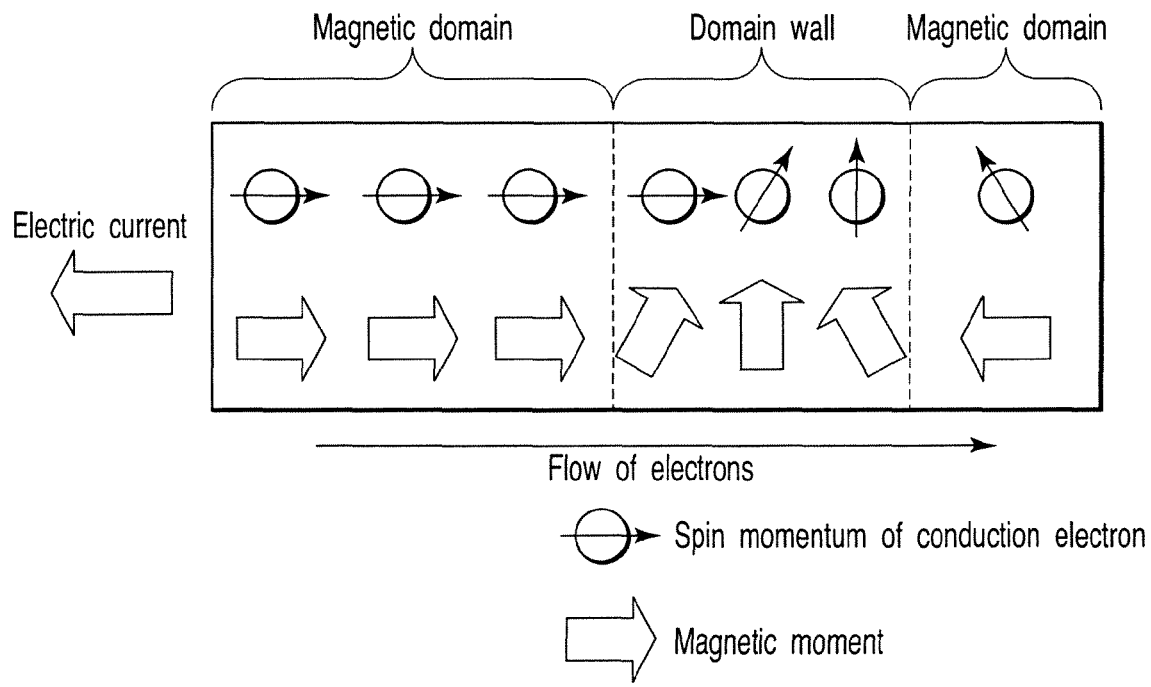
Figure 7G:
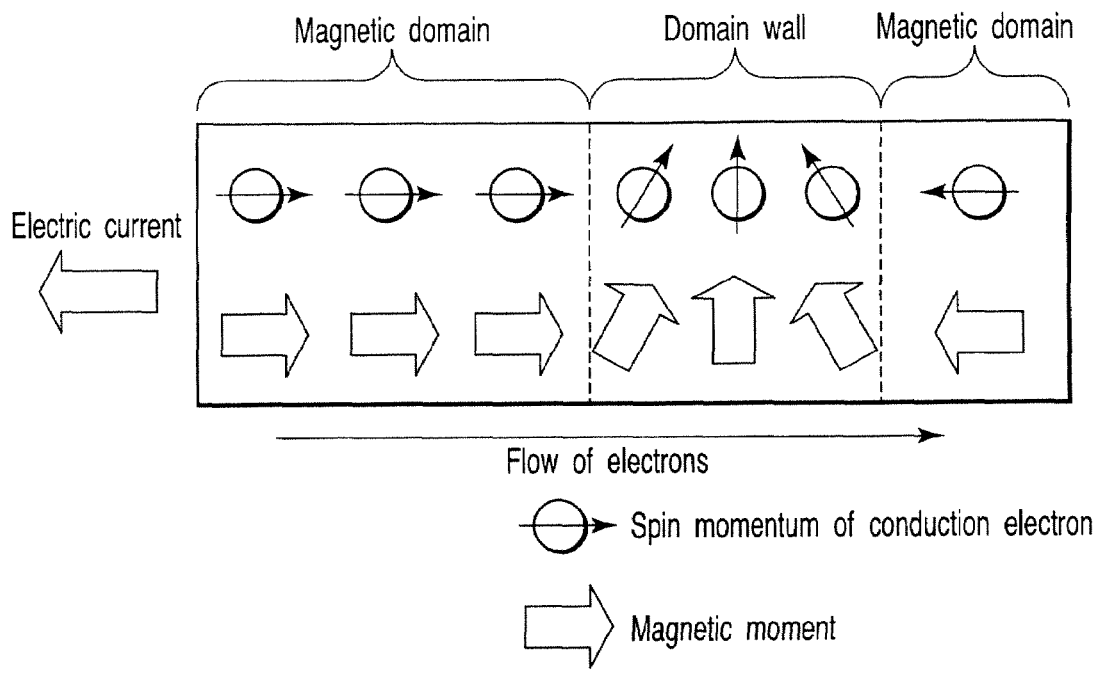
Figure 7H:
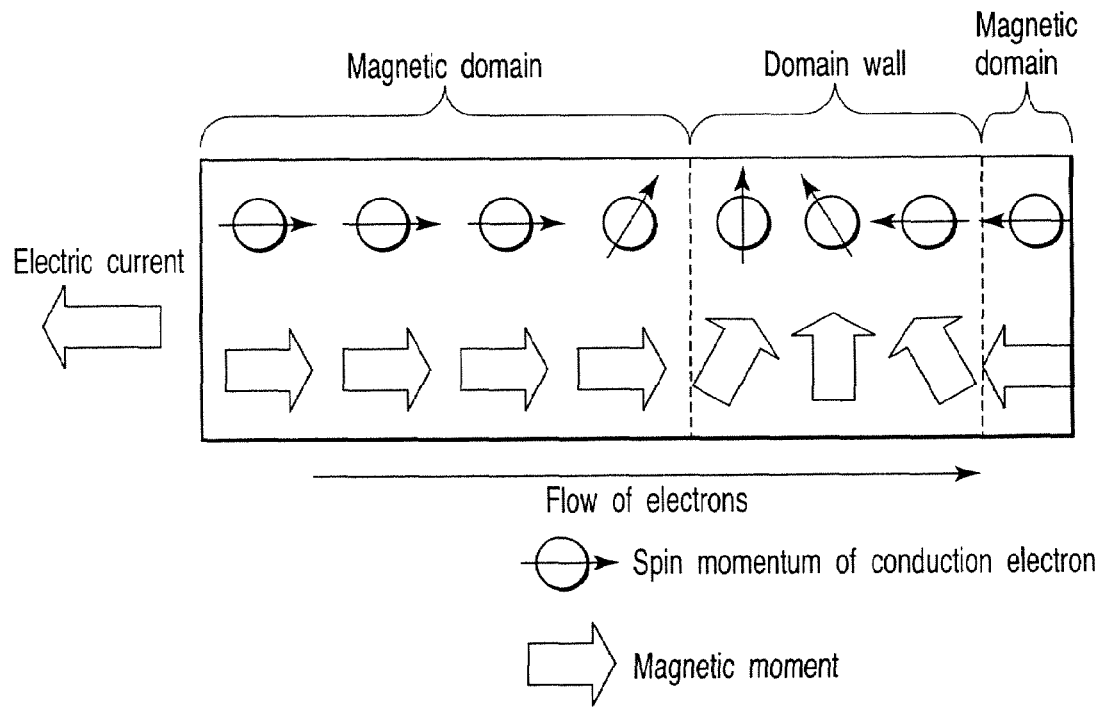

First, when an electric current flows through a ferromagnetic material, electrons (conduction electron) flow in the opposite direction to the electric current in the ferromagnetic material. Each of conduction electrons enters the domain wall while holding its spin momentum (FIG. 7B). However, each spin momentum of conduction electrons are rotated to parallel or anti-parallel with the magnetic moment in the domain wall (FIG. 7C). To compensate for the rotation of the spin momentum of the conduction electron (to conserve the angular momentum), the magnetic moment rotates (FIG. 7D). Accordingly, the conduction electron and magnetic moment exchange their angular momenta. Each of conduction electrons further flows (FIG. 7E), and enters the domain wall while holding its spin momentum (FIG. 7F). However, each spin momentum of the conduction electrons are rotated to parallel or anti-parallel with the magnetic moment in the domain wall (FIG. 7G). To compensate for the rotation of the spin direction of the conduction electron (to conserve the angular momentum), the spin of an electron which causes the magnetic moment rotates (FIG. 7H). Therefore, the spin momentum of the conduction electron and magnetic moment exchange their angular momenta. As a result, the domain wall moves.

Note that the moving distance of the domain wall is proportional to, e.g., the electric current amount or the length of a current pulse, so the domain wall is moved by a current pulse having an appropriate length. Even when the domain wall moving amount is slightly inappropriate, no problem arises if the formation position of the domain wall is determined and the magnetic moments in the magnetic domain point are in a predetermined direction.

[1-4] Effects

In U.S. Pat. No. 6,834,005, for example, a write element and read element are not formed at the end portions of a magnetic shift register 40 but formed on the bottom portion of the magnetic shift register 40 having a U shape. In this structure, not all cells in the magnetic shift register 40 can be used as memory cells. If all cells in the magnetic shift register 40 are used as data regions 35 and the target cell as an object of read is moved to the position immediately above a read element 20, data is discharged outside the magnetic shift register 40 by the cell moving amount and lost. The same inconvenience can happen in data write as well.

By contrast, the first embodiment forms the write element 20 and read element 30 at the two ends of the magnetic line (magnetic shift register) 10. To move the target cell to the position immediately above the write element 20 or read element 30, information discharged from the magnetic line 10 is read out and written in the magnetic domain 11 at the start position of domain wall motion. Since this logically forms a looped magnetic shift register, all the magnetic domains 11 in the magnetic line 10 can be used as memory cells. Consequently, a high cell density achieves a large-capacity memory.

Second Embodiment

The second embodiment stacks magnetic lines in the first embodiment described above. Note that in the second embodiment, an explanation of the same features as in the first embodiment will be omitted.

Figure 8:
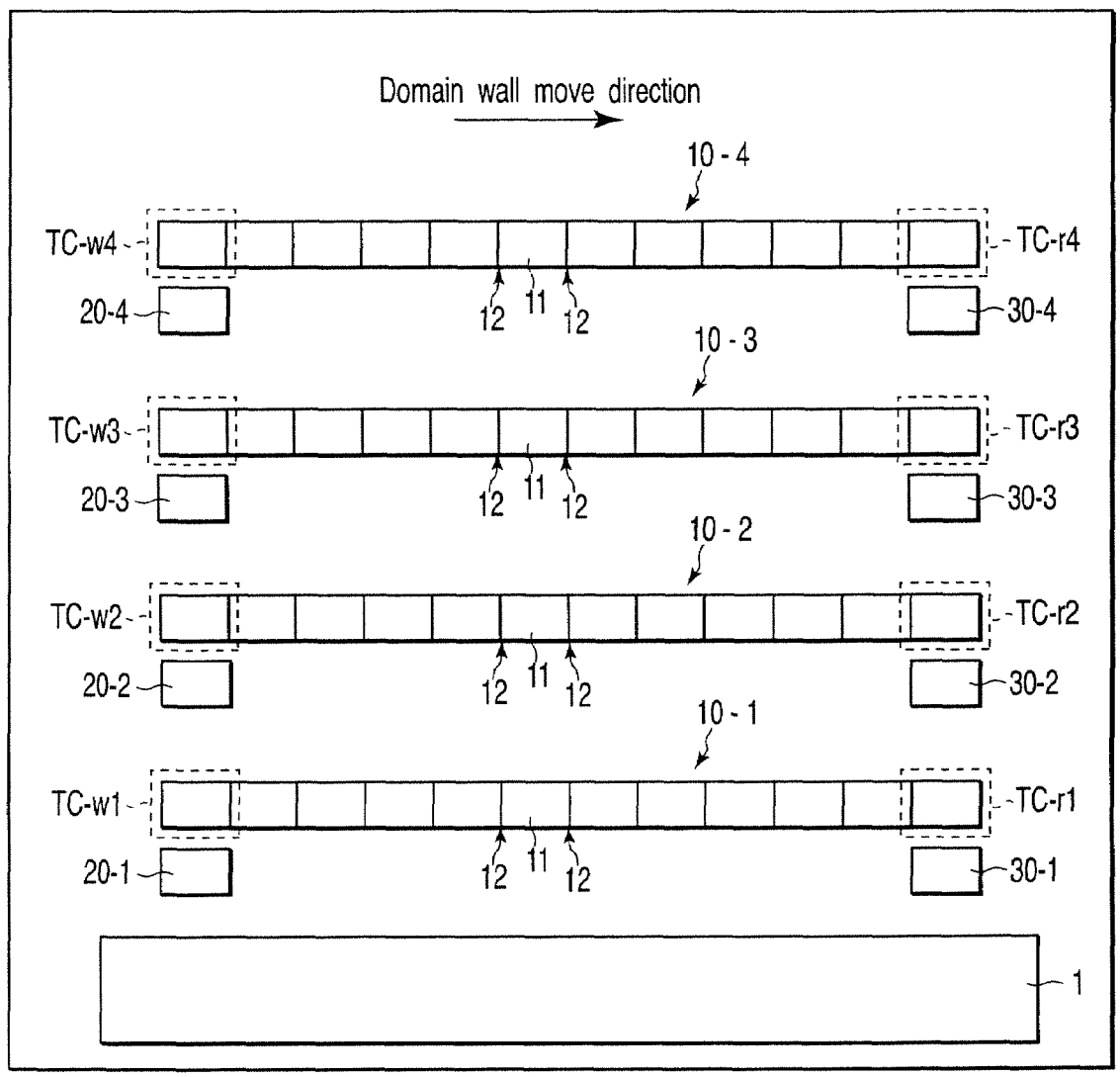
FIG. 8 is a schematic view showing a magnetic memory device according to the second embodiment of the present invention.

FIGS. 8 and 9 are schematic views of a magnetic memory device according to the second embodiment of the present invention. The structure of this magnetic memory device according to the second embodiment will be explained below.

As shown in FIG. 8, the second embodiment differs from the first embodiment in that magnetic lines 10-1, 10-2, 10-3, and 10-4 are stacked above a semiconductor substrate 1.

A write element 20-1 and read element 30-1 are arranged at the two end portions of the magnetic line 10-1 to write data in and read out data from target cells TC-w1 and TC-r1, respectively.

A write element 20-2 and read element 30-2 are arranged at the two end portions of the magnetic line 10-2 to write data in and read out data from target cells TC-w2 and TC-r2, respectively.

A write element 20-3 and read element 30-3 are arranged at the two end portions of the magnetic line 10-3 to write data in and read out data from target cells TC-w3 and TC-r3, respectively.

A write element 20-4 and read element 30-4 are arranged at the two end portions of the magnetic line 10-4 to write data in and read out data from target cells TC-w4 and TC-r4, respectively.

The write elements 20-1, 20-2, 20-3, and 20-4 are respectively separated from the magnetic lines 10-1, 10-2, 10-3, and 10-4, and made of, e.g., metal lines. The read elements 30-1, 30-2, 30-3, and 30-4 are made of, e.g., magnetoresistive effect elements using the TMR effect as shown in FIGS. 2A and 2B.

A current source (not shown) which applies an electric current Is for moving the domain walls of the magnetic lines 10-1, 10-2, 10-3, and 10-4 is formed at the end portions of the magnetic lines 10-1, 10-2, 10-3, and 10-4.

Note that the write and read elements can also be shared by the upper and lower magnetic lines sandwiching the elements. For example, as shown in FIG. 9, magnetic lines 10-1 and 10-2 share a write element 20-1 and read element 30-1 formed between them, and magnetic lines 10-3 and 10-4 share a write element 20-2 and read element 30-2 formed between them. This structure can reduce the cell area in the stacking direction.

The second embodiment described above can achieve the same effects as in the first embodiment. In addition, the second embodiment can further increase the capacity of a magnetic memory by stacking magnetic lines.

[3] Third Embodiment

In the third embodiment, a magnetic line has a three-dimensional U shape. Note that in the third embodiment, an explanation of the same features as in the first embodiment described above will be omitted.

Figure 10:
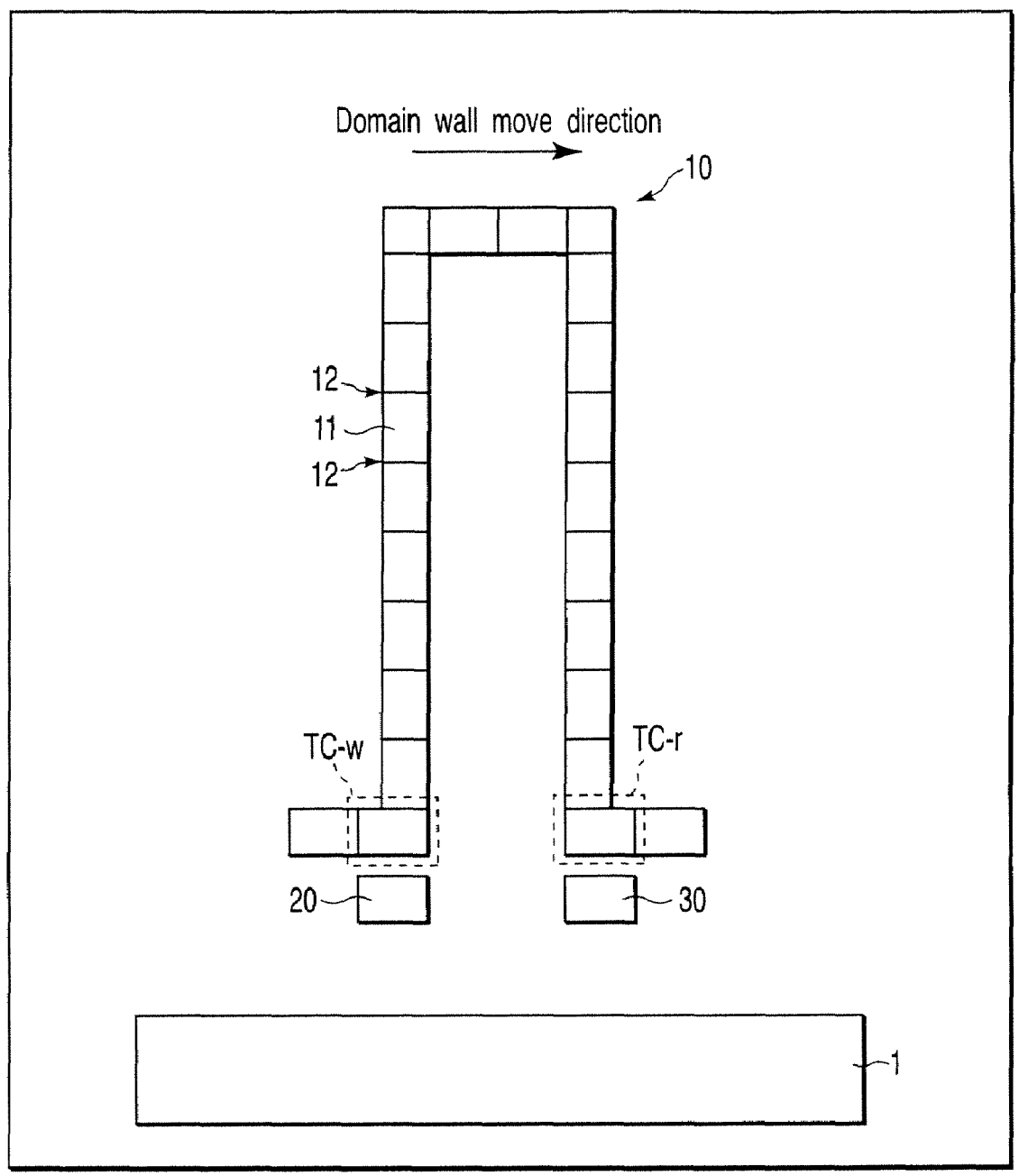
FIG. 10 is a schematic view showing a magnetic memory device according to the third embodiment of the present invention.

FIG. 10 is a schematic view of a magnetic memory device according to the third embodiment of the present invention. The structure of this magnetic memory device according to the third embodiment will be explained below.

As shown in FIG. 10, the third embodiment differs from the first embodiment in that a magnetic line 10 has an inverted U shape with respect to the substrate surface of a semiconductor substrate 1. In this case, a write element 20 and read element 30 are desirably arranged at those end portions of the magnetic line 10 which oppose the semiconductor substrate 1, since these elements are connected to an integrated circuit (not shown) of the semiconductor substrate 1.

The third embodiment described above can achieve the same effects as in the first embodiment. In addition, the third embodiment can reduce the cell area in the lateral direction by using the U-shaped magnetic line, and can increase the capacity by thus increasing the cell density.

[4] Fourth Embodiment

In each embodiment described above, the domain wall move direction is one direction. In the fourth embodiment, domain wall can be moved to both directions. Note that in the fourth embodiment, an explanation of the same features as in the above embodiments will be omitted.

Figure 11:
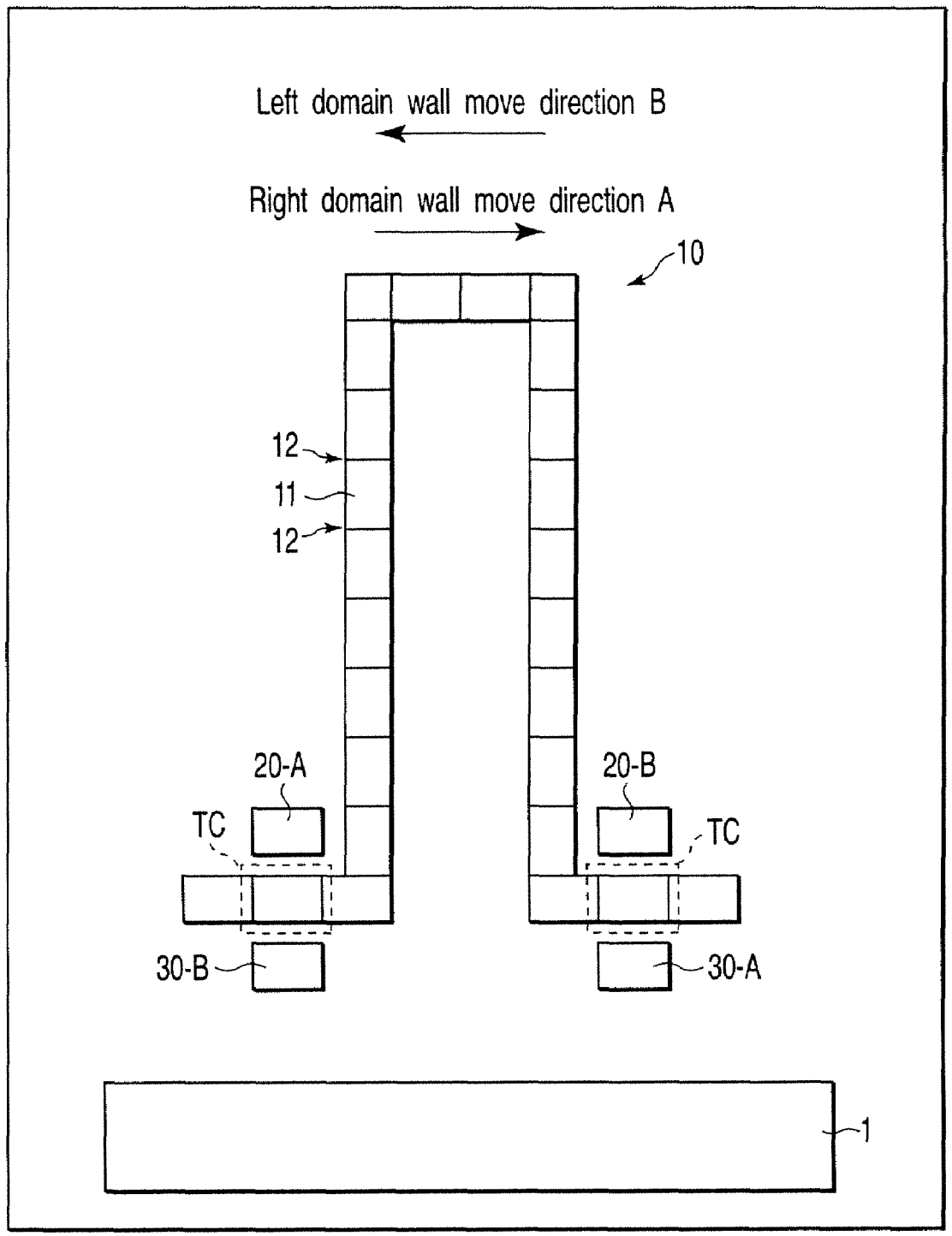
FIG. 11 is a schematic view showing a magnetic memory device according to the fourth embodiment of the present invention.

FIG. 11 is a schematic view of a magnetic memory device according to the fourth embodiment of the present invention. The structure of this magnetic memory device according to the fourth embodiment will be explained below.

As shown in FIG. 11, a write element 20-A for domain wall motion in a right direction A and a read element 30-B for domain wall motion in a left direction B are arranged at one end portion of a magnetic line 10 so as to sandwich the magnetic line 10 between them. A read element 30-A for domain wall motion in the right direction A and a write element 20-B for domain wall motion in the left direction B are arranged at the other end portion of the magnetic line 10 so as to sandwich the magnetic line 10 between them.

The write elements 20-A and 20-B are arranged above the magnetic line 10, and the read elements 30-A and 30-B are arranged below the magnetic line 10. In this structure, it is only necessary to arrange the write elements at the start position of the domain wall move direction, and the read elements at the end position of the domain wall move direction. Therefore, it is of course also possible to arrange the write elements 20-A and 20-B below the magnetic line 10, and the read elements 30-A and 30-B above the magnetic line 10.

The fourth embodiment described above can achieve the same effects as in the first embodiment. In addition, the fourth embodiment can increase the degree of freedom of the data shift direction because domain walls 12 can be moved to both directions in the magnetic line 10. Although the fourth embodiment requires two read elements and two write elements unlike in the other embodiments, the use of the stacked structure prevents the increase in area.

Note that the fourth embodiment is a modification of the third embodiment, but it can also be a modification of another embodiment.

Note also that the domain walls can be moved to the right and left directions during. Therefore, the initialization speed can be increased by changing the move directions depending on the target read or write addresses.

[5] Fifth Embodiment

The first to fourth embodiments described above use the magnetic field writing method, but the fifth embodiment uses the spin injection writing method.

[5-1] Arrangement of Magnetic Memory Device

Figure 12:
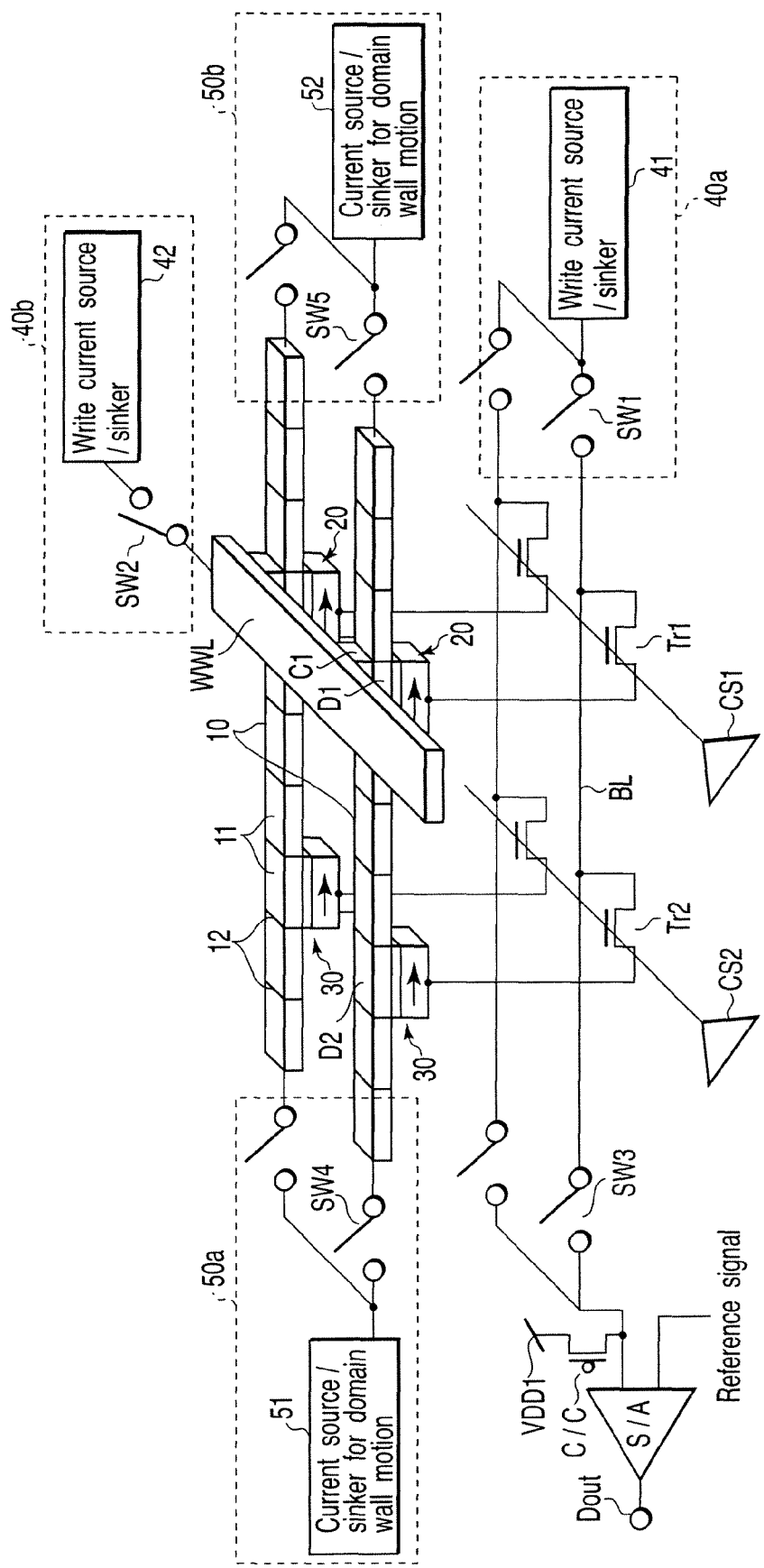
FIG. 12 is a schematic circuit diagram showing a magnetic memory device according to the fifth embodiment of the present invention.

FIG. 12 is a schematic circuit diagram of a magnetic memory device according to the fifth embodiment of the present invention. The circuit configuration of the magnetic memory device according to the fifth embodiment will be explained below.

As shown in FIG. 12, magnetic lines 10 having, e.g., a linear shape are arranged. Each magnetic line 10 is made of a ferromagnetic material and functions as a storage element. The magnetic line 10 has rectangular regions called magnetic domains 11 at a predetermined pitch. In each magnetic domain 11, the spins of electrons point in a predetermined direction. Domain walls 12 exist in the boundaries between the magnetic domains 11. In the magnetic line 10, therefore, each magnetic domain 11 partitioned by the domain walls 12 functions as a cell, and information "1" or "0" is recorded in each cell made of the magnetic domain 11.

A write element 20 connects to a portion below a magnetic domain D1 of the magnetic line 10. The write element 20 connects in series with one end of the current path of a transistor Tr1 for accessing the write element 20. A bit line BL connects to the other end of the current path of the transistor Tr1. A write current source/sinker 41 connects to the bit line BL via a switch SW1. A control signal CS1 controls the gate of the transistor Tr1.

A write word line WWL connects to a portion above the magnetic domain D1 of the magnetic line 10 via a contact C1. A write current source/sinker 42 connects to the write word line WWL via a switch SW2.

A read element 30 connects to a portion below a magnetic domain D2 of the magnetic line 10. The read element 30 connects in series with one end of the current path of a transistor Tr2 for accessing the read element 30. The bit line BL connects to the other end of the current path of the transistor Tr2. A control signal CS2 controls the gate of the transistor Tr2.

The bit line BL connects to one input terminal of a sense amplifier S/A via a switch SW3. This input terminal connects to a current conveyor C/C made of, e.g., a p-channel MOS transistor, and the current conveyor C/C connects to a power supply VDD1. The other input terminal of the sense amplifier S/A receives a reference signal RS.

Current sources/sinkers for domain wall motion 51 and 52 connect to the two end portions of the magnetic line 10 via switches SW4 and SW5, respectively. The current sources/sinkers for domain wall motion 51 and 52 are designed so as to move the domain walls 12 by one magnetic domain 11 by applying a predetermined current value to the magnetic line 10 for only a predetermined time. To perform domain wall motion, the switches SW4 and SW5 are turned on to connect the current sources/sinkers for domain wall motion 51 and 52 to the magnetic line 10 to apply pulse currents. Consequently, a write target cell TC-w moves to the magnetic domain D1 immediately above the write element 20, and a read target cell TC-r moves to the magnetic domain D2 immediately above the read element 30.

Note that the write element 20 and read element 30 can also be formed at the end portions of the magnetic line 10 as in the first embodiment.

Figure 13:
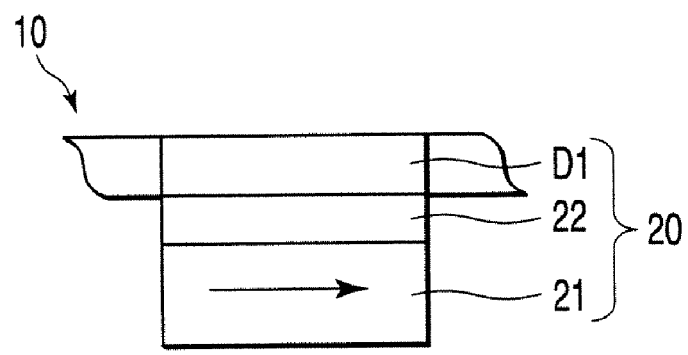
FIG. 13 is a schematic sectional view showing a write element according to the fifth embodiment of the present invention.

FIG. 13 is a schematic sectional view of the write element according to the fifth embodiment of the present invention. This write element according to the fifth embodiment will be explained below.

As shown in FIG. 13, the write element 20 has a fixed layer 21 in which the magnetization direction is fixed, the magnetic domain D1 of the magnetic line 10, and a nonmagnetic layer 22 formed in contact with the magnetic domain D1 between the fixed layer 21 and magnetic domain D1. The magnetic line 10 and fixed layer 21 are made of ferromagnetic layers. The nonmagnetic layer 22 is made of, e.g., Cu or Ru. The fixed layer 21 has a large coercive force Hc, and the coercive force of the magnetic line 10 is set smaller than that of the fixed layer 21.

The write element 20 as described above is a structure including the magnetic domain D1 of the magnetic line 10, and is a so-called CPP-GMR (Current-Perpendicular-to-Plane-Giant Magneto Resistive) element (a magnetoresistive effect element). The write element 20 corresponds to the plurality of magnetic domains 11 of the magnetic line 10.

Figure 14A:
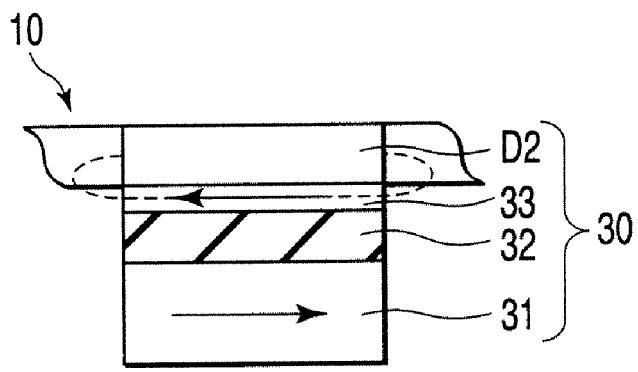
FIGS. 14A and 14B are schematic sectional views showing read elements according to the fifth embodiment of the present invention.
Figure 14B:
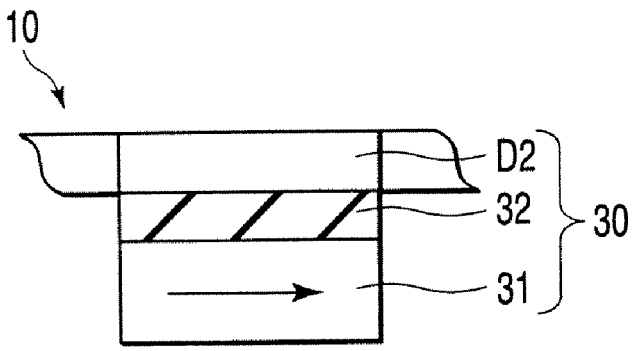

FIGS. 14A and 14B are schematic sectional views of the read element according to the fifth embodiment of the present invention. This read element according to the fifth embodiment will be explained below.

As shown in FIG. 14A, the first example of the read element 30 has a fixed layer 31 in which the magnetization direction is fixed, a recording layer 33 formed in contact with the magnetic domain D2 and capable of reversing the magnetization direction, an insulating layer 32 formed between the fixed layer 31 and recording layer 33, and the magnetic domain D2 of the magnetic line 10. The recording layer 33 is preferably made of a material which allows a leakage magnetic field from the magnetic domain D2 to reverse the magnetization direction in the recording layer 33. The insulating layer 32 is made of alumina (e.g., $Al_2O_3$) or the like.

As shown in FIG. 14B, the second example of the read element 30 omits the recording layer 33 by allocating a portion corresponding to the recording layer 33 to the magnetic domain D2. The read element 30 has a fixed layer 31 in which the magnetic direction is fixed, the magnetic domain D2 of the magnetic line 10, and an insulating layer 32 formed in contact with the magnetic domain D2 between the fixed layer 31 and magnetic domain D2.

The read element 30 as described above has the structure (FIG. 14A) connected to the magnetic domain D2 of the magnetic line 10 or the structure (FIG. 14B) including the magnetic domain D2, and is an MTJ element (magnetoresistive effect element) using the TMR effect. The read element 30 corresponds to the plurality of magnetic domains 11 of the magnetic line 10.

Figure 16A:
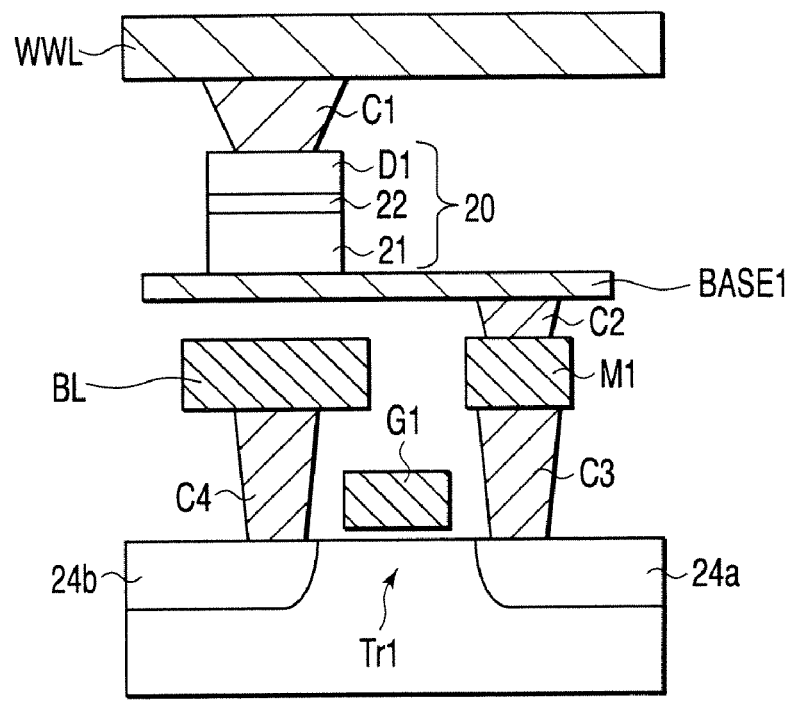
FIG. 16A is a sectional view taken along a line XVIA-XVIA in FIG. 15.
Figure 16B:
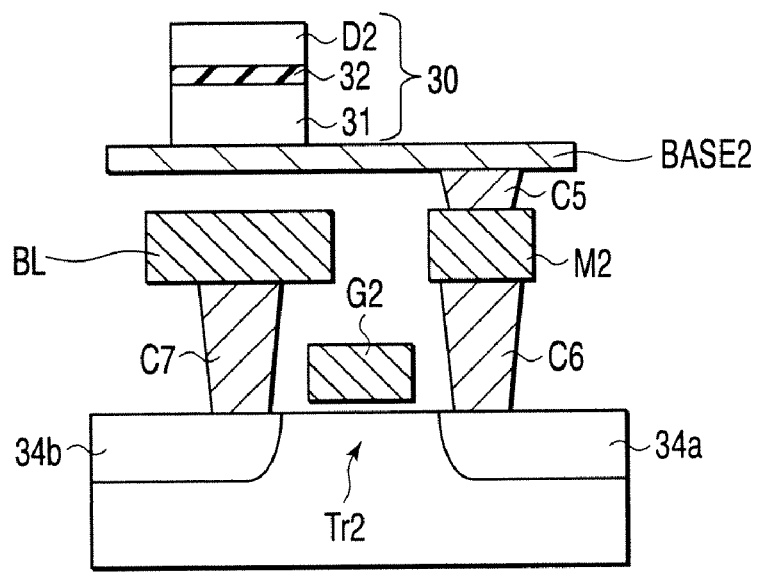
FIG. 16B is a sectional view taken along a line XVIB-XVIB in FIG. 15.

FIG. 15 is a schematic view showing the layout of the magnetic memory device according to the fifth embodiment of the present invention. FIG. 16A is a sectional view taken along a line XVIA-XVIA in FIG. 15. FIG. 16B is a sectional view taken along a line XVIB-XVIB in FIG. 15. The layout and partial sectional structures of the magnetic memory device according to the fifth embodiment will be explained below.

As shown in FIG. 15, the linear magnetic lines 10 run in the X direction, and the two ends of each magnetic line 10 connect to selector, decoder and current sources/sinkers for domain wall motion 50a and 50b. For example, the two ends of the magnetic line 10 connect to the current sources/sinkers for domain wall motion 51 and 52 via the switches SW4 and SW5 (selectors) as shown in FIG. 12.

The bit line BL runs in the X direction below the magnetic line 10. One end of the bit line BL connects to a selector, decoder and write current source/sinker circuit 40a. For example, one end of the bit line BL connects to the write current source/sinker 41 via the switch SW1 (selector) as shown in FIG. 12. For example, the other end of the bit line BL connects to the sense amplifier S/A and current conveyor C/C via the switch SW3 (column selector (CSL)) as shown in FIG. 12.

The write word line WWL runs in the Y direction. One end of the write word line WWL connects to a selector, decoder and write current source/sinker circuit 40b. For example, one end of the write word line WWL connects to the write current source/sinker 42 via the switch SW2 (selector) as shown in FIG. 12.

The write element 20 is placed at the intersection of the write word line WWL and magnetic line 10. As shown in FIG. 16A, one end (the magnetic domain D1 of the magnetic line 10) of the write element 20 connects to the write word line WWL via the contact C1, and the other end (fixed layer 21) of the write element 20 connects to a base layer BASE1. The transistor Tr1 is formed below the write element 20. A diffusion layer 24a of the transistor Tr1 connects to the base layer BASE1 via a contact C3, line M1, and contact C2. A diffusion layer 24b of the transistor Tr1 connects to the bit line BL via a contact C4. The write element 20 having the above arrangement is accessed by controlling a gate electrode G1 of the transistor Tr1 by using an external address signal.

The read element 30 is placed below the magnetic line 10 so as to be separated from the write element 30. As shown in FIG. 16B, one end (the fixed layer 31) of the read element 30 connects to a base layer BASE2. The transistor Tr2 is formed below the read element 30. A diffusion layer 34a of the transistor Tr2 connects to the base layer BASE2 via a contact C6, line M2, and contact C5. A diffusion layer 34b of the transistor Tr2 connects to the bit line BL via a contact C7. The read element 30 having the above arrangement is accessed by controlling a gate electrode G2 of the transistor Tr2 by using an external address signal.

Figure 17:
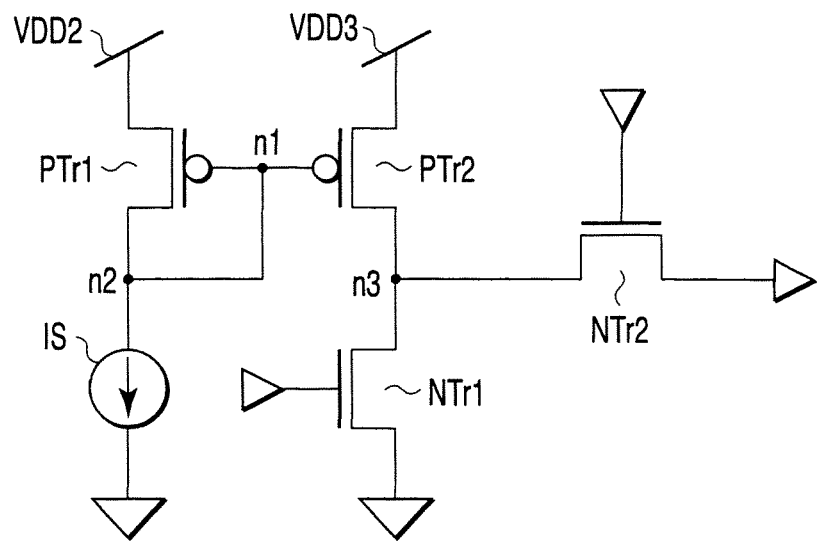
FIG. 17 is a circuit diagram showing, e.g., a write current source according to the fifth embodiment of the present invention.

FIG. 17 is a circuit diagram of the write current source and the like according to the fifth embodiment of the present invention. The write current source and the like according to the fifth embodiment of the present invention will be explained below.

As shown in FIG. 17, the gates of p-channel MOS transistors PTr1 and PTr2 connect to a node n1. The current path of the p-channel MOS transistor PTr1 has one end connected to a power supply VDD2 and the other end connected to a node n2. The node n2 connects to the node n1 and a constant-current source IS. The current path of the p-channel MOS transistor PTr2 has one end connected to a power supply VDD3 and the other end connected to a node n3. One end of the current path of each of an n-channel MOS transistor NTr1 (sinker) and n-channel MOS transistor NTr2 (decoder) connects to the node n3.

[5-2] Write/Read Operation (Write Method)

Figure 19A:
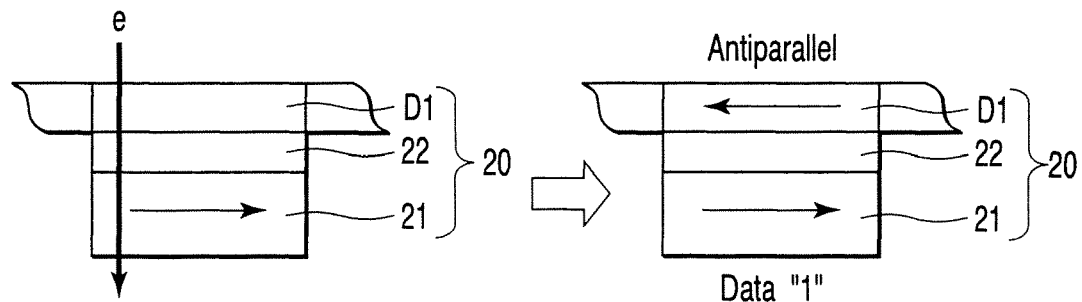
FIG. 19A is a sectional view of the write element when spin injection write (data "1") according to the fifth embodiment of the present invention is performed.
Figure 19B:
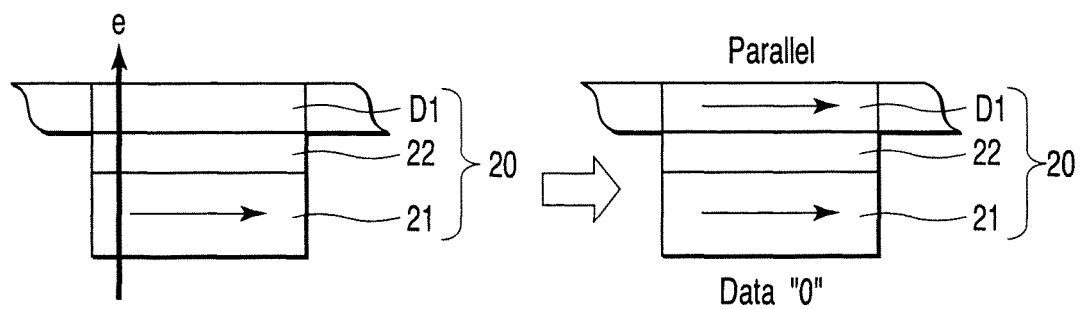
FIG. 19B is a sectional view of the write element when spin injection write (data "0") according to the fifth embodiment of the present invention is performed.
Figure 18:
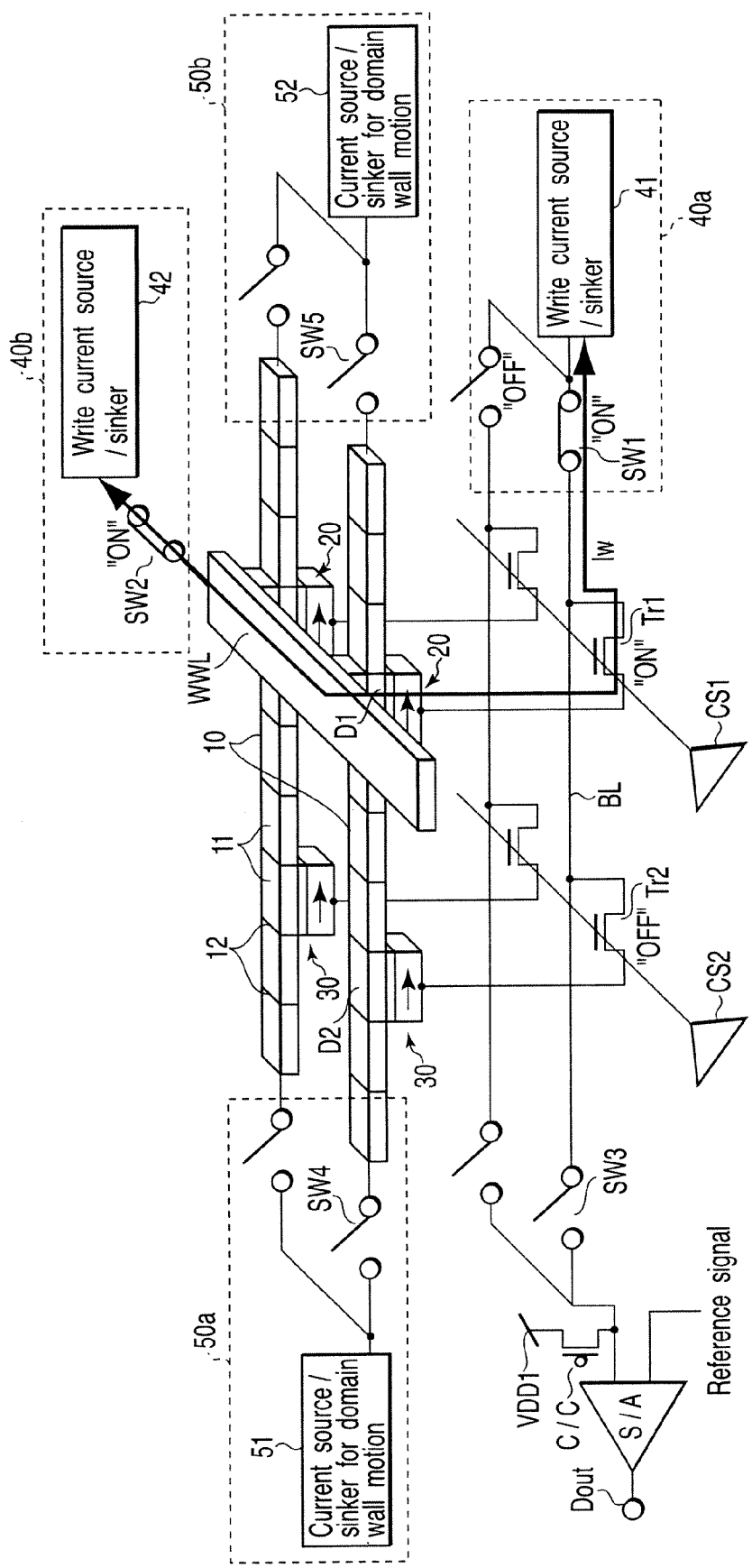
FIG. 18 is a schematic circuit diagram for explaining a write operation according to the fifth embodiment of the present invention.

FIG. 18 is a schematic circuit diagram for explaining a write operation according to the fifth embodiment of the present invention. FIG. 19A is a sectional view of the write element when spin injection write (data "1") according to the fifth embodiment of the present invention is performed. FIG. 19B is a sectional view of the write element when spin injection write (data "0") according to the fifth embodiment of the present invention is performed. The write operation according to the fifth embodiment of the present invention will be explained below. Assume that the write element 20 is already in contact with a magnetic domain (the target cell TC-w) to be written.

First, as shown in FIG. 18, the switches SW1 and SW2 and the gate of the transistor Tr1 are turned on to apply a write current Iw between the write current source/sinkers 41 and 42. Note that the write current Iw does not flow to any other elements because the switch SW5 and the gate of the transistor Tr2 are kept off.

Data "1" and "0" can be selectively written by changing the direction of the write current Iw. That is, when electrons e flow from the magnetic domain D1 to the fixed layer 21 as shown in FIG. 19A, the spin injection technique makes the magnetization direction in the magnetic domain D1 opposite (antiparallel) to that in the fixed layer 21. In this case, the write element 20 has a high resistance, and this state is defined as, e.g., data "1". On the other hand, when the electrons e flow from the fixed layer 21 to the magnetic domain D1 as shown in FIG. 19B, the spin injection technique makes the magnetization direction in the magnetic domain D1 equal (parallel) to that in the fixed layer 21. In this case, the write element 20 has a low resistance, and this state is defined as, e.g., data "0".

(Read Method)

Figure 20:
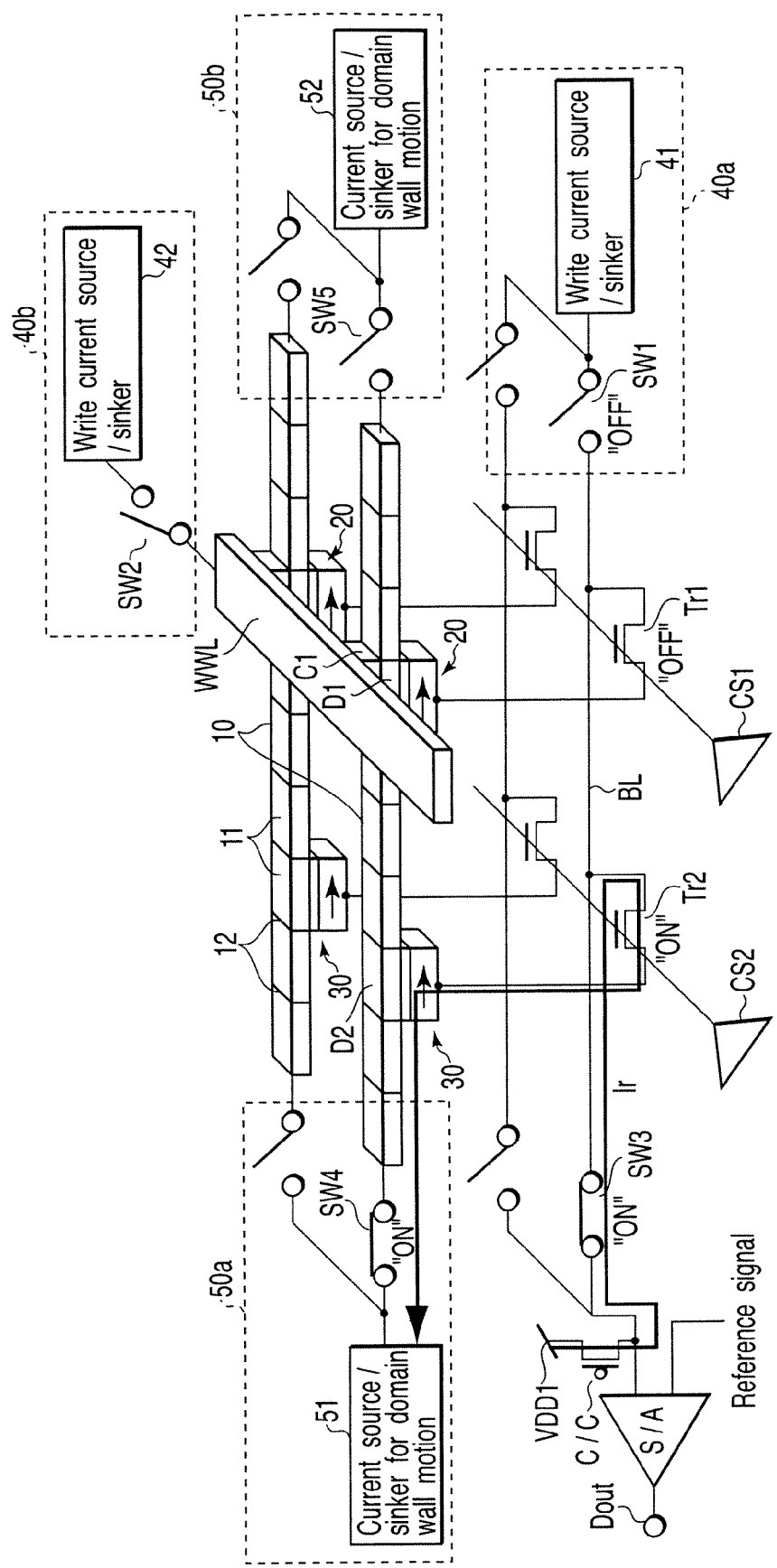
FIG. 20 is a schematic circuit diagram for explaining a read operation according to the fifth embodiment of the present invention.
Figure 21:
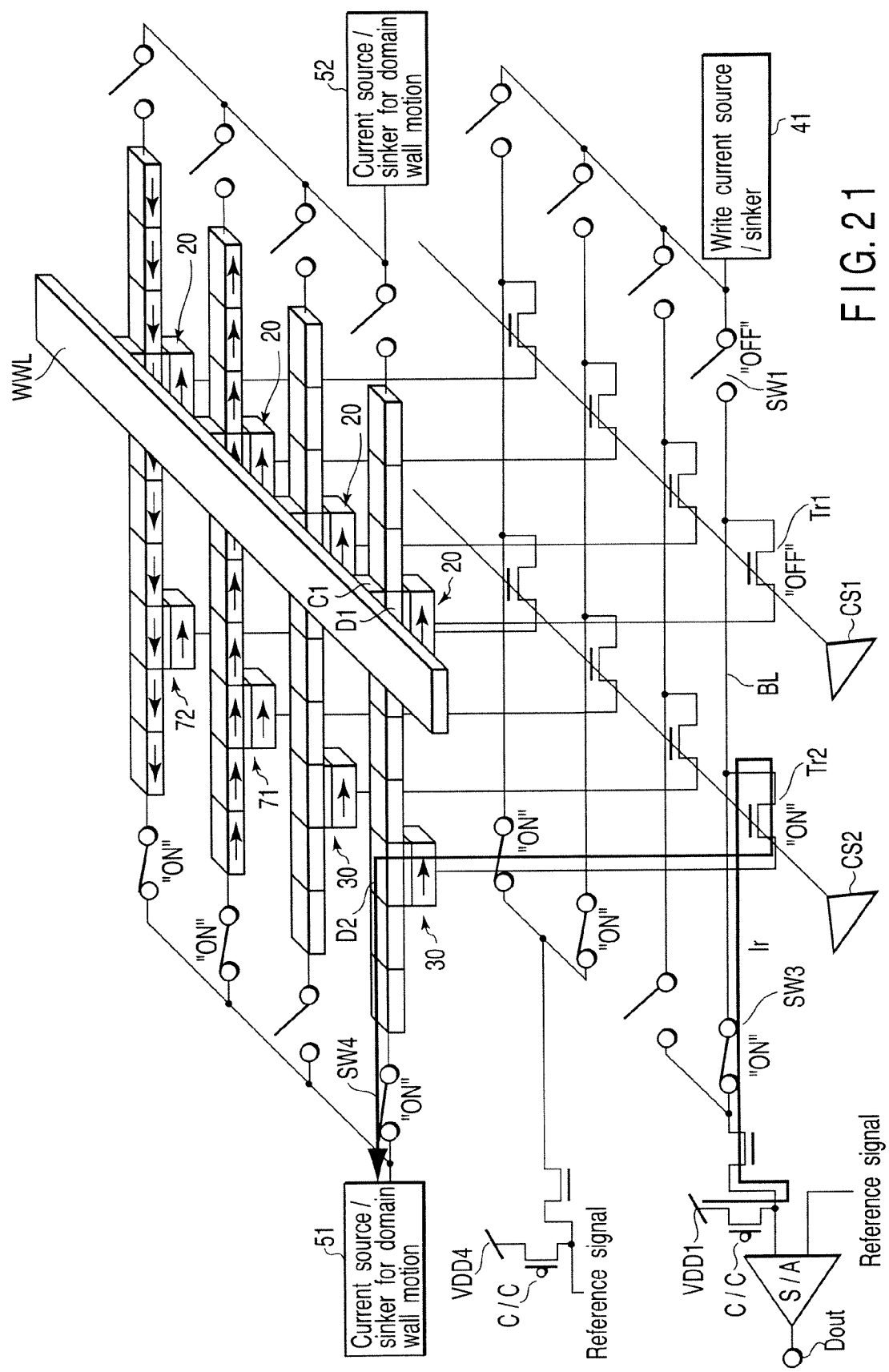
FIG. 21 is a schematic circuit diagram for explaining a read operation using a reference cell according to the fifth embodiment of the present invention.
Figure 22:
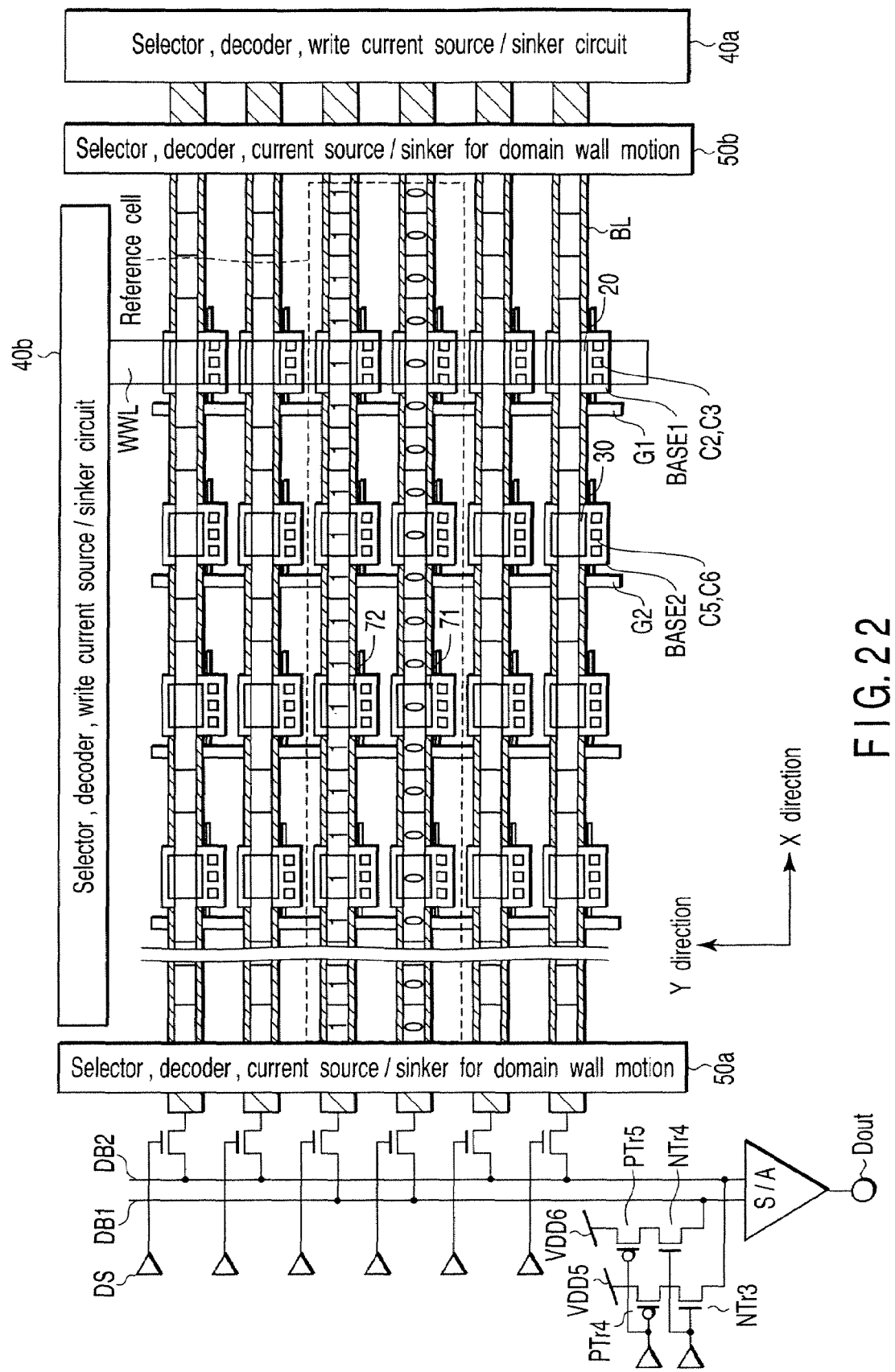
FIG. 22 is a schematic view showing the layout of a magnetic memory device having a reference cell according to the fifth embodiment of the present invention.

FIG. 20 is a schematic circuit diagram for explaining a read operation according to the fifth embodiment of the present invention. FIG. 21 is a schematic circuit diagram for explaining a read operation using a reference cell according to the fifth embodiment of the present invention. FIG. 22 is a schematic view showing the layout of a magnetic memory device having a reference cell according to the fifth embodiment of the present invention. The read operation according to the fifth embodiment of the present invention will be explained below. Assume that the read element 30 is already in contact with a magnetic domain (the target cell TC-r) to be read with.

First, as shown in FIG. 20, the switches SW3 and SW4 and the gate of the transistor Tr2 are turned on to ground the current source/sinker for domain wall motion 51. Note that the switch SW1 and the gate of the transistor Tr1 are kept off. This applies the read current Ir from the current conveyor C/C to the read element 30 via the transistor Tr2. A signal which appears on the bit line BL changes in accordance with the magnetization direction in the magnetic domain D2 in contact with the read element 30. The sense amplifier S/A compares this signal with a reference signal RS, thereby reading out information from the magnetic domain D2.

For example, the reference signal RS for read is generated as follows. As shown in FIGS. 21 and 22, of an even number of (e.g., two) magnetic lines 10 in an array central portion, data "0" is prewritten in the magnetic domains 11 of one magnetic line 10, and data "1" is prewritten in the magnetic domains 11 of the other magnetic line 10. Accordingly, a reference element 71 in which data "0" is written and a reference element 72 in which data "1" is written exist as reference cells. In a read operation, a voltage value (the reference signal RS) intermediate between the signal of the reference element 71 having data "0" and the signal of the reference element 72 having data "1" appears on a data bus DB1. The sense amplifier S/A compares the reference signal RS with that signal of the target cell TC-r which has appeared on a data bus DB2.

(Address Detection)

Figure 23:
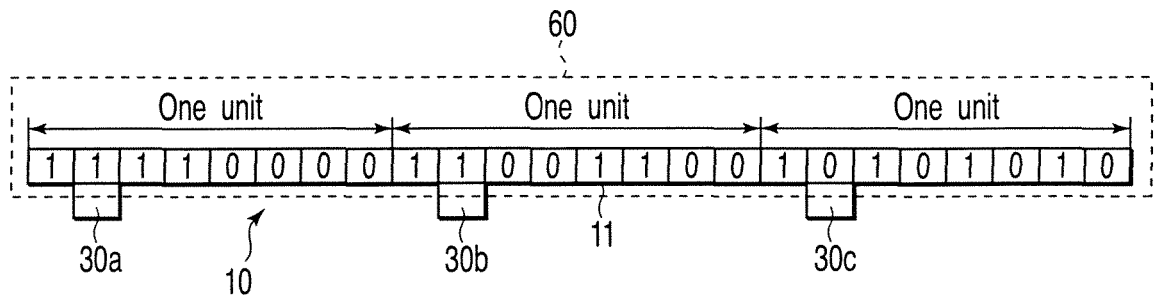
FIG. 23 is a schematic view for explaining an address detection method according to the fifth embodiment of the present invention.
Figure 24:
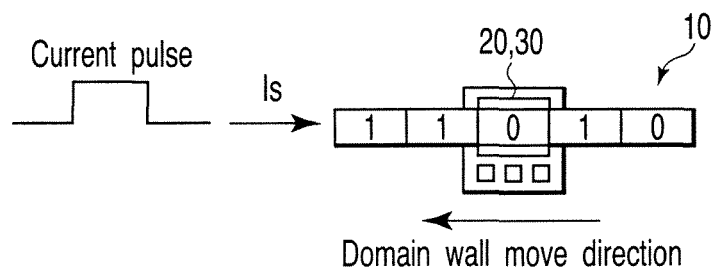
FIG. 24 is a schematic view for explaining the generation of a current pulse according to the fifth embodiment of the present invention.
Figure 24:
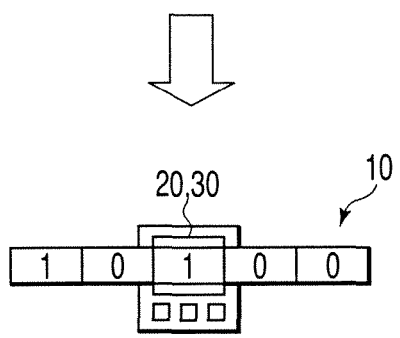

FIG. 23 is a schematic view for explaining an address detection method according to the fifth embodiment of the present invention. FIG. 24 is a schematic view for explaining the generation of a current pulse according to the fifth embodiment of the present invention. The address detection method according to the fifth embodiment of the present invention will be explained below.

In either of data write or read, it is necessary to previously specify the addresses of the magnetic domains D1 and D2 currently being accessed (touched) by the write element 20 and read element 30, in order to check whether the magnetic domains D1 and D2 are the target cells TC-w and TC-r.

As shown in FIG. 23, therefore, an address detection pattern 60 in which data "1" and "0" are prewritten is desirably formed in a predetermined region of the magnetic line 10. Address read elements 30a, 30b, and 30c connect to the address detection pattern 60, and read out data "1" and "0" of the magnetic domains 11 in contact with the address read elements 30a, 30b, and 30c. Note that the user cannot access the address detection pattern 60.

In this example shown in FIG. 23, one unit is made up of eight magnetic domains 11, and each of the three address read elements 30a, 30b, and 30c reads out data from a specific cell in one unit. This specifies the addresses of the magnetic domains D1 and D2 currently being accessed (touched) by the write element 20 and read element 30. The addresses thus read out are stored in registers or the like.

Note that if the addresses of the magnetic domains D1 and D2 are different from those of the target cells TC-w and TC-r, the current source/sinker for domain wall motion generates current pulses to move the domain walls for each pulse (FIG. 24). For example, the current source/sinker is designed so as to move one magnetic domain 11 in the magnetic line 10 by one current pulse. This brings the target cells TC-w and TC-r to be accessed into contact with the write element 20 and read element 30. The moving amount of domain wall movement is made smaller by one than the number of the magnetic domains forming one unit.

(Sequence of Write Operation)

Figure 25:
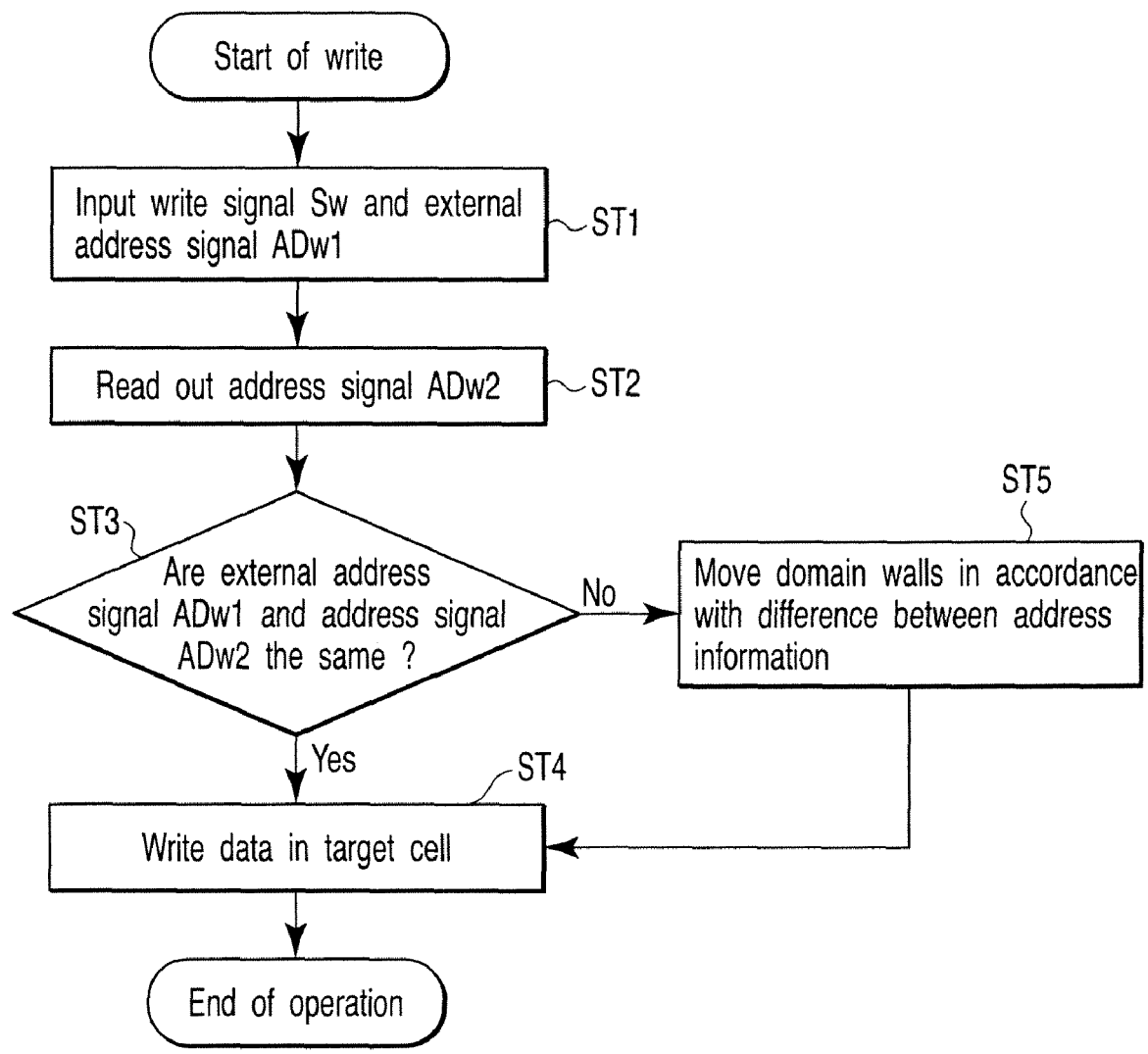
FIG. 25 is a sequence diagram of a write operation according to the fifth embodiment of the present invention.

FIG. 25 is a sequence diagram of a write operation according to the fifth embodiment of the present invention. The sequence of this write operation according to the fifth embodiment of the present invention will be explained below.

First, a write signal Sw and an external address signal (a signal of the target cell TC-w) ADw1 are input from outside the chip (ST1). Subsequently, an address signal ADw2 in one unit is read out by using, e.g., the address detection pattern 60 shown in FIG. 23 (ST2). The address signal ADw2 is temporarily stored in a register or the like, and used to specify the address of the magnetic domain D1 in contact with the write element 20. Then, the address signal ADw2 and external address signal ADw1 are compared (ST3).

If the address signal ADw2 and external address signal ADw1 are the same, information is written in the target cell TC-w by the spin injection technique (ST4). In this manner, the write operation is completed.

On the other hand, if the address signal ADw2 and external address signal ADw1 are different, a current pulse equivalent to the difference between the pieces of address information of the two signals is applied to the magnetic line to move the domain walls (ST5). After that, information is written in the target cell TC-w by the spin injection technique (ST4). In this way, the write operation is completed.

(Sequence of Read Operation)

Figure 26:
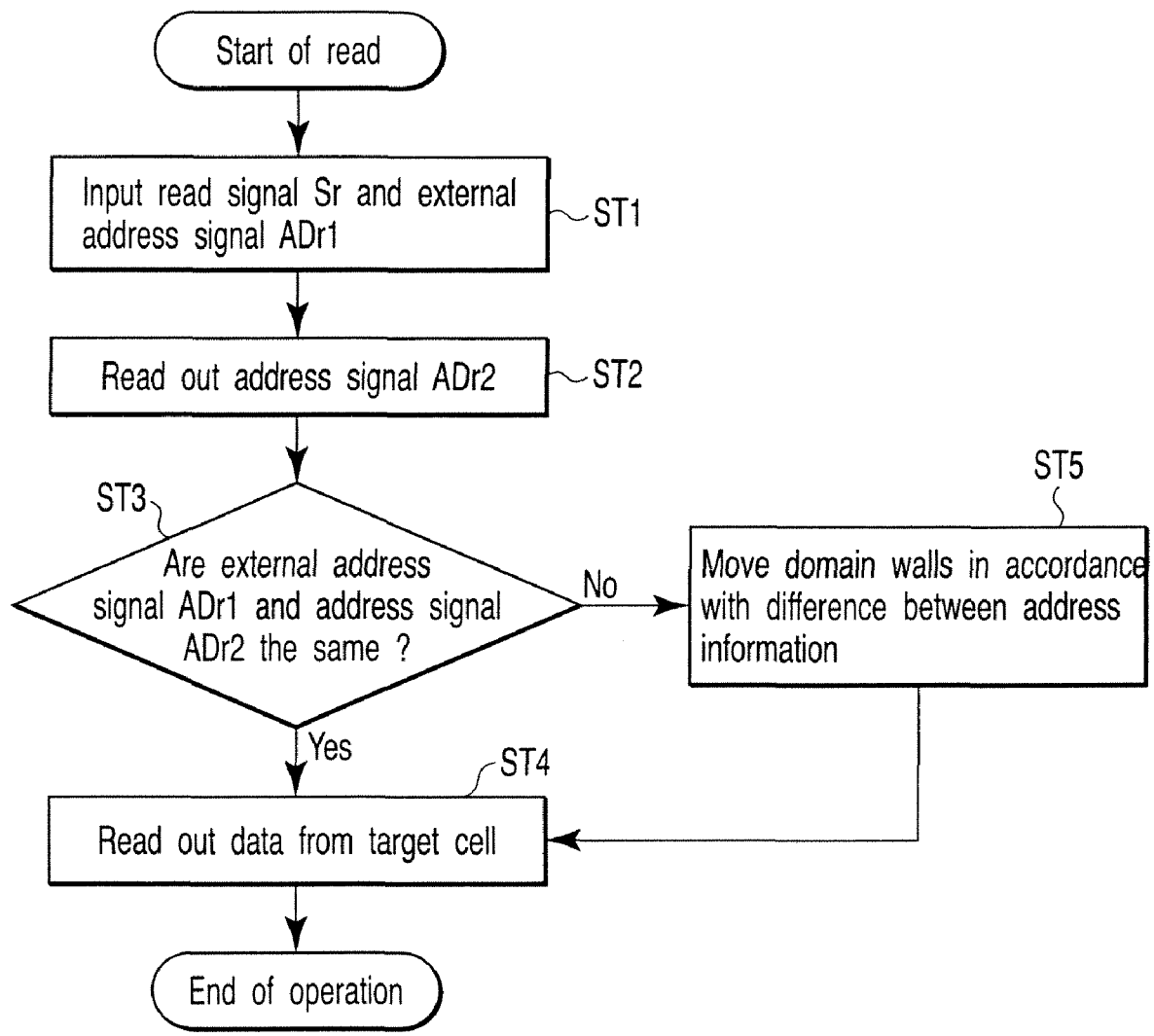
FIG. 26 is a sequence diagram of a read operation according to the fifth embodiment of the present invention.

FIG. 26 is a sequence diagram of a read operation according to the fifth embodiment of the present invention. The sequence of this read operation according to the fifth embodiment of the present invention will be explained below.

First, a read signal Sr and an external address signal (a signal of the target cell TC-r) ADr1 are input from outside the chip (ST1). Subsequently, an address signal ADr2 in one unit is read out by using, e.g., the address detection pattern 60 shown in FIG. 23 (ST2). The address signal ADr2 is temporarily stored in a register or the like, and used to specify the address of the magnetic domain D2 in contact with the read element 30. Then, the address signal ADr2 and external address signal ADr1 are compared (ST3).

If the address signal ADr2 and external address signal ADr1 are the same, information in the target cell TC-r is read out by the TMR effect (ST4). In this manner, the read operation is completed.

On the other hand, if the address signal ADr2 and external address signal ADr1 are different, a current pulse equivalent to the difference between the pieces of address information of the two signals is applied to the magnetic line to move the domain walls (ST5). After that, information in the target cell TC-r is read out by the TMR effect (ST4). In this way, the write operation is completed.

[5-3] Effects

The use of the magnetic field writing method in data write may pose the problem of miss-writing caused by a stray magnetic field to a peripheral cell. This problem becomes more serious when increasing the density and capacity by micropatterning.

By contrast, the fifth embodiment uses the write element 20 connected to the magnetic line (magnetic shift register) 10 to write data in a predetermined magnetic domain 11 of the magnetic line 10 by the spin injection technique. Accordingly, the fifth embodiment directly applies an electric current to the magnetic domain 11 to be written, and allows spin polarized electrons generated by this electric current to act on magnetization. Since this prevents the problem of a stray magnetic field caused by the magnetic field writing method, it is possible to suppress data destruction caused by miss-writing better than in the magnetic field writing method. This makes it possible to improve the reliability of a memory element, and implement a high-density, large-capacity magnetic memory by micropatterning.

[6] Sixth Embodiment

The sixth embodiment uses a write method combining both the spin injection magnetization reversing method and magnetic field writing method. Note that an explanation of the same features as in the fifth embodiment will be omitted.

Figure 27:
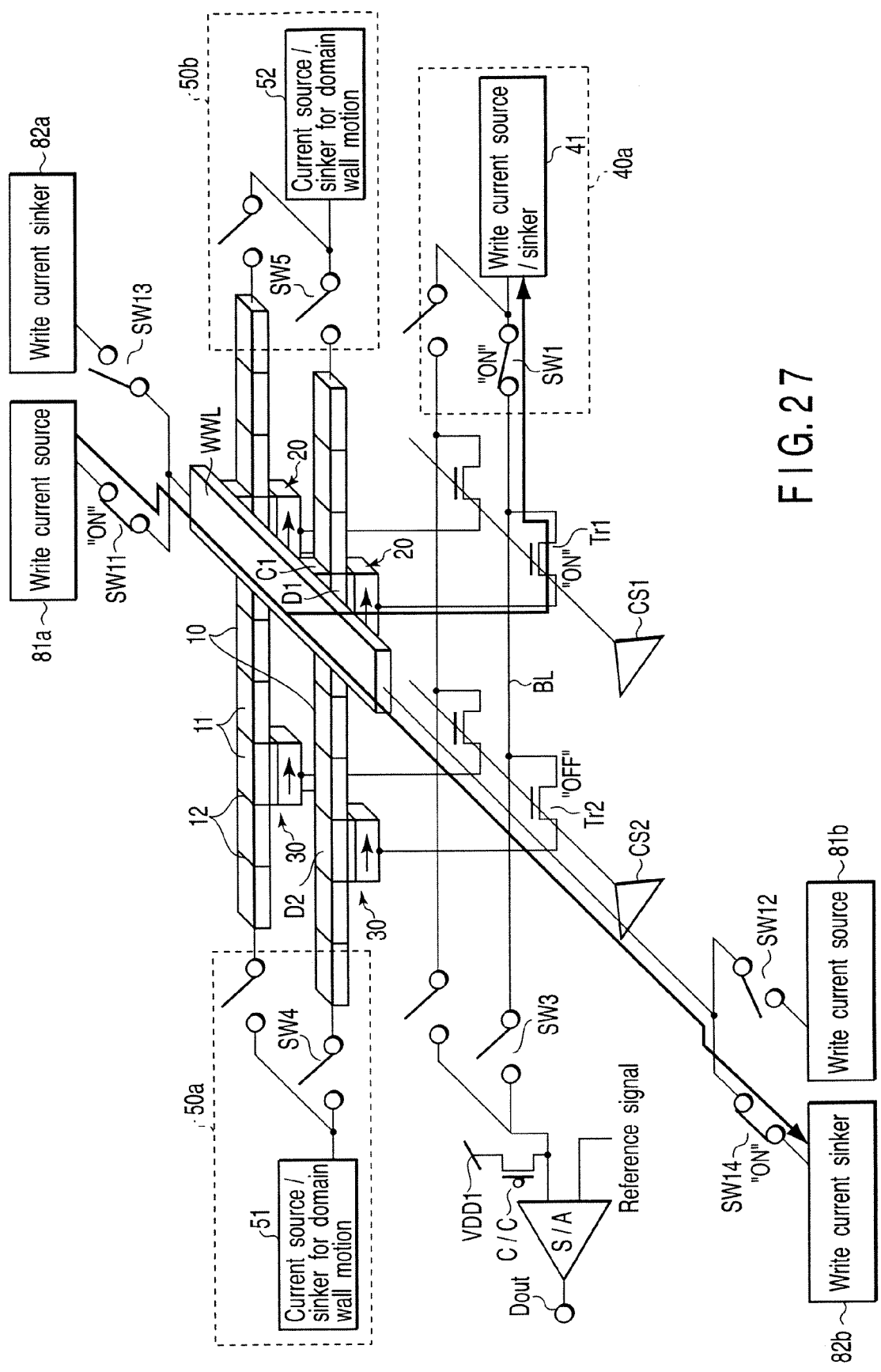
FIG. 27 is a schematic circuit diagram for explaining a write operation according to the sixth embodiment of the present invention.
Figure 28A:
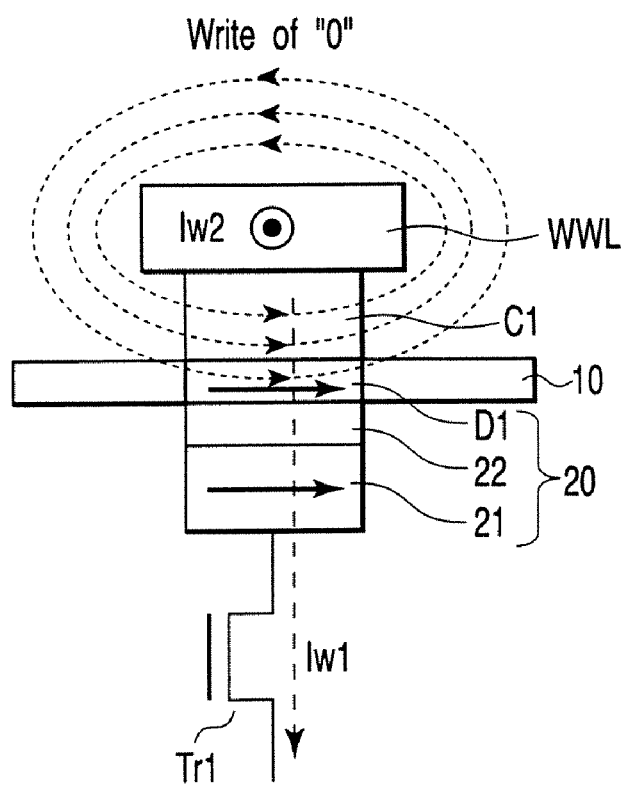
FIG. 28A is a view for explaining data "0" write according to the sixth embodiment of the present invention.
Figure 28B:
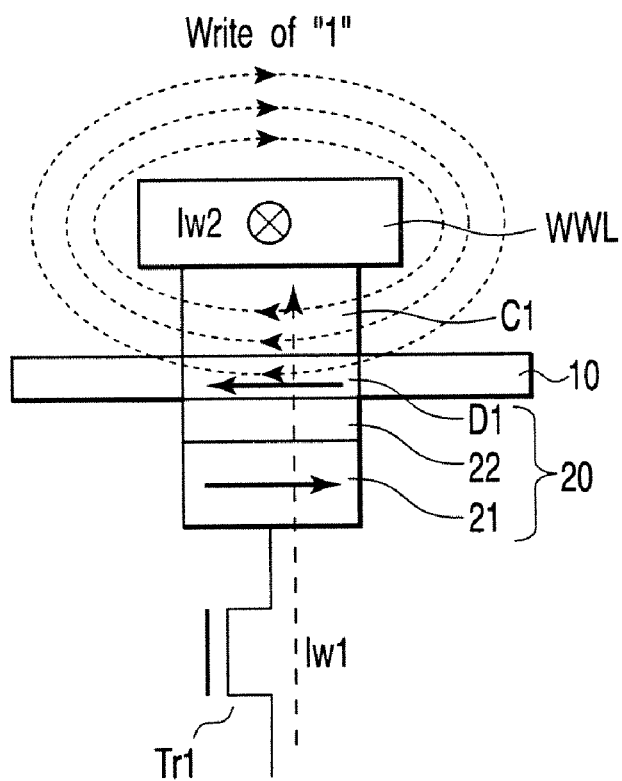
FIG. 28B is a view for explaining data "1" write according to the sixth embodiment of the present invention.

FIG. 27 is a schematic circuit diagram for explaining a write operation according to the sixth embodiment of the present invention. FIG. 28A is a view for explaining data "0" write according to the sixth embodiment of the present invention. FIG. 28B is a view for explaining data "1" write according to the sixth embodiment of the present invention. The write operation according to the sixth embodiment of the present invention will be explained below. Assume that a write element 20 is already in contact with a magnetic domain (target cell TC-w) to be written.

As shown in FIG. 27, a write word line WWL has one end connected to a write current source 81a and sinker 82a, and the other end connected to a write current source 81b and sinker 82b.

Data "0" is written as follows. First, as shown in FIG. 27, switches SW1, SW11, and SW14 and the gate of a transistor Tr1 are turned on to apply write currents Iw1 and Iw2.

The write current Iw1 flows from the write current source 81a to the write element 20 via the write word line WWL, and flows into a write current source/sinker 41 via the transistor Tr1 and a bit line BL. As a consequence, spin polarized electrons act on magnetization in a magnetic domain D1. On the other hand, the write current Iw2 flows from the write current source 81a to the write current sinker 82b via the write word line WWL. Consequently, a magnetic field generated by the write current Iw2 acts on magnetization in the magnetic domain D1.

As shown in FIG. 28A, these actions of the two write currents Iw1 and Iw2 make the magnetization direction in the magnetic domain D1 equal (parallel) to that in a fixed layer 21. Consequently, data "0" having a low resistance is written in the write element 20.

Data "1" is written as follows. First, the switch SW1, a switch SW12, and a switch SW13 and the gate of the transistor Tr1 are turned on to apply the write currents Iw1 and Iw2.

The write current Iw1 flows from the write current source/sinker 41 to the write element 20 via the bit line BL and transistor Tr1, and flows into the write current sinker 82a via the write word line WWL. As a consequence, spin polarized electrons act on magnetization in the magnetic domain D1. On the other hand, the write current Iw2 flows from the write current source 81b to the write current sinker 82a via the write word line WWL. Consequently, a magnetic field generated by the write current Iw2 acts on magnetization in the magnetic domain D1.

As shown in FIG. 28B, these actions of the two write currents Iw1 and Iw2 make the magnetization direction in the magnetic domain D1 opposite (antiparallel) to that in the fixed layer 21. Consequently, data "1" having a high resistance is written in the write element 20.

The sixth embodiment described above can achieve the same effects as in the fifth embodiment. The sixth embodiment can also reduce the write currents by using not only the spin injection technique but also the magnetic field writing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a first magnetic line which has a plurality of cells made of magnetic domains partitioned by domain walls, and in which information is recorded in each cell;
   a first write element formed at one end portion of the first magnetic line;
   a first read element formed at the other end portion of the first magnetic line; and
   a register configured to temporarily store data, which is read by said first read element, of a first cell at the other end portion of the first magnetic line, wherein
   the first write element is configured to write the temporally stored data into a second cell at the one end portion of the first magnetic line.

2. The device according to claim 1, wherein
   the first write element is a line separated from the first magnetic line, and
   information is written in a target cell positioned at one end portion of the first magnetic line by applying a magnetic field of an electric current flowing through the line to the target cell.

3. The device according to claim 1, wherein
   the first read element is a magnetoresistive effect element including a fixed layer, a recording layer opposing a target cell positioned at the other end portion of the first magnetic line, and a nonmagnetic layer formed between the fixed layer and the recording layer, and information in the target cell is read out by supplying an electric current to the first read element by reversing magnetization in the recording layer in accordance with a magnetization direction in the target cell.

4. The device according to claim 1, wherein the first read element is a magnetoresistive effect element including a fixed layer, a target cell positioned at the other end portion of the first magnetic line, and a nonmagnetic layer formed in contact with the target cell between the fixed layer and the target cell, and information in the target cell is read out by supplying an electric current to the first read element.

5. The device according to claim 1, further comprising a current source which applies an electric current which moves the domain walls in a direction from one end portion to the other end portion of the first magnetic line.

6. The device according to claim 1, further comprising:

a second magnetic line which is formed above the first magnetic line and has a plurality of cells made of magnetic domains partitioned by domain walls, and in which information is recorded in each cell;

a second write element formed at one end portion of the second magnetic line; and a second read element formed at the other end portion of the second magnetic line.

7. The device according to claim 1, further comprising a second magnetic line which is formed above the first magnetic line and has a plurality of cells made of magnetic domains partitioned by domain walls, and in which information is recorded in each cell;

wherein the first write element is formed between one end portion of the first magnetic line and one end portion of the second magnetic line, and the first read element is formed between the other end portion of the first magnetic line and the other end portion of the second magnetic line.

8. The device according to claim 1, wherein a shape of the first magnetic line is an inverted U shape.

9. The device according to claim 1, further comprising:

a second read element formed at one end portion of the first magnetic line, and sandwiching the first magnetic line together with the first write element;

a second write element formed at the other end portion of the first magnetic line, and sandwiching the first magnetic line together with the first read element;

a first current source which applies an electric current which moves the domain walls in a direction from one end portion to the other end portion of the first magnetic line; and a second current source which applies an electric current which moves the domain walls in a direction from the other end portion to one end portion of the first magnetic line.

10. A write method of a magnetic memory device including a first magnetic line which has a plurality of cells made of magnetic domains partitioned by domain walls, and in which information is recorded in each cell, a first write element formed at one end portion of the first magnetic line, and a first read element formed at the other end portion of the first magnetic line, comprising:

checking whether a target cell as an object of write exists at one end portion of the first magnetic line;

writing information in the target cell by using the first write element, if a result of the check indicates that the target cell exists at one end portion of the first magnetic line;

reading out information from a first cell at the other end portion of the first magnetic line by using the first read element, if the result of the check indicates that the target cell does not exist at one end portion of the first magnetic line;

temporally storing the information of the first cell;

moving the domain walls by one cell by supplying an electric current to the first magnetic line, and writing the information of the first cell, which is temporally stored, into a second cell at one end portion of the first magnetic line by using the first write element; and checking whether the second cell is the target cell as the object of write, after moving the domain walls by one cell by supplying the electric current to the first magnetic line.

11. The method according to claim 10, wherein the first write element is a line separated from the first magnetic line, and the information is written in the target cell by applying a magnetic field of an electric current flowing through the line to the target cell.

12. The method according to claim 10, wherein the first read element is a magnetoresistive effect element including a fixed layer, a recording layer opposing the first cell, and a nonmagnetic layer formed between the fixed layer and the recording layer, and the information in the first cell is read out by supplying an electric current to the first read element by reversing magnetization in the recording layer in accordance with a magnetization direction in the first cell.

13. The method according to claim 10, wherein the first read element is a magnetoresistive effect element including a fixed layer, the first cell, and a nonmagnetic layer formed in contact with the first cell between the fixed layer and the first cell, and the information in the first cell is read out by supplying an electric current to the first read element.

14. The method according to claim 10, wherein the magnetic memory device further includes:

a second read element formed at one end portion of the first magnetic line, and sandwiching the first magnetic line together with the first write element;

a second write element formed at the other end portion of the first magnetic line, and sandwiching the first magnetic line together with the first read element;

a first current source which applies the electric current which moves the domain walls in a direction from one end portion to the other end portion of the first magnetic line; and a second current source which applies the electric current which moves the domain walls in a direction from the other end portion to one end portion of the first magnetic line.

15. The method according to claim 10, wherein the information is written in the target cell by applying an electric current in a direction perpendicular to film surfaces of the target cell and the first write element.

16. A read method of a magnetic memory device including a first magnetic line which has a plurality of cells made of magnetic domains partitioned by domain walls, and in which information is recorded in each cell, a first write element formed at one end portion of the first magnetic line, and a first read element formed at the other end portion of the first magnetic line, comprising:

checking whether a target cell as an object of read exists at the other end portion of the first magnetic line;

reading out information from the target cell by using the first read element, if a result of the check indicates that the target cell exists at the other end portion of the first magnetic line;

reading out information from a first cell at the other end portion of the first magnetic line by using the first read element, if the result of the check indicates that the target cell does not exist at the other end portion of the first magnetic line;

temporally storing the information of the first cell;

moving the domain walls by one cell by supplying an electric current to the first magnetic line, and writing the information of the first cell, which is temporally stored, into a second cell at one end portion of the first magnetic line by using the first write element; and checking whether a third cell at the other end portion of the first magnetic line is the target cell as the object of read, after moving the domain walls by one cell by supplying the electric current to the first magnetic line.

17. The method according to claim 16, wherein the first write element is a line separated from the first magnetic line, and the information of the first cell is written in the second cell by applying a magnetic field of an electric current flowing through the line to the second cell.

18. The method according to claim 16, wherein the first read element is a magnetoresistive effect element including a fixed layer, a recording layer opposing the target cell, and a nonmagnetic layer formed between the fixed layer and the recording layer, and the information in the target cell is read out by supplying an electric current to the first read element by reversing magnetization in the recording layer in accordance with a magnetization direction in the target cell.

19. The method according to claim 16, wherein the first read element is a magnetoresistive effect element including a fixed layer, the target cell, and a nonmagnetic layer formed in contact with the target cell between the fixed layer and the target cell, and the information in the target cell is read out by supplying an electric current to the first read element.

20. The method according to claim 16, wherein the magnetic memory device further includes:

a second read element formed at one end portion of the first magnetic line, and sandwiching the first magnetic line together with the first write element;

a second write element formed at the other end portion of the first magnetic line, and sandwiching the first magnetic line together with the first read element;

a first current source which applies the electric current which moves the domain walls in a direction from one end portion to the other end portion of the first magnetic line; and a second current source which applies the electric current which moves the domain walls in a direction from the other end portion to one end portion of the first magnetic line.

* * * * *